United States Patent
Lahouti et al.

(10) Patent No.: US 11,297,657 B2
(45) Date of Patent: Apr. 5, 2022

(54) CODED RANDOM ACCESS MECHANISM FOR COMMUNICATION NETWORKS

(71) Applicant: California Institute of Technology, Pasadena, CA (US)

(72) Inventors: Farshad Lahouti, San Gabriel, CA (US); Victoria Kostina, Pasadena, CA (US); Mohammadreza Ebrahimi, Plano, IL (US)

(73) Assignee: California Institute of Technology, Pasadena, CA (US)

( * ) Notice: Subject to any disclaimer, the term of this patent is extended or adjusted under 35 U.S.C. 154(b) by 59 days.

(21) Appl. No.: 16/362,567

(22) Filed: Mar. 22, 2019

(65) Prior Publication Data
US 2019/0297649 A1    Sep. 26, 2019

Related U.S. Application Data

(60) Provisional application No. 62/646,698, filed on Mar. 22, 2018.

(51) Int. Cl.
*H04W 74/08* (2009.01)
*H03M 13/25* (2006.01)
(Continued)

(52) U.S. Cl.
CPC ..... *H04W 74/0841* (2013.01); *H03M 13/255* (2013.01); *H04L 1/0027* (2013.01);
(Continued)

(58) Field of Classification Search
CPC ..................... H04W 74/0841; H03M 13/255
See application file for complete search history.

(56) References Cited

U.S. PATENT DOCUMENTS

| 8,169,954 B2 * | 5/2012 | Usuda | H04W 28/22 |
| | | | 370/329 |
| 10,028,302 B2 * | 7/2018 | Au | H04W 72/02 |

(Continued)

FOREIGN PATENT DOCUMENTS

| EP | 3447943 A1 | 2/2019 |
| WO | 2014025366 A1 | 2/2014 |
| WO | 2019183601 A1 | 9/2019 |

OTHER PUBLICATIONS

International Search Report and Written Opinion for International Application No. PCT/US2019/023755, Search completed Jul. 10, 2019, dated Jul. 10, 2019, 10 pgs.

(Continued)

*Primary Examiner* — James P Duffy
(74) *Attorney, Agent, or Firm* — KPPB LLP

(57) ABSTRACT

Coded access communication systems and methods are described. In one embodiment, the communication system includes a plurality of transmitters that transmit signals via a random access channel, where each transmitter includes: an encoder that encodes data bits using a two-layer code including an inner medium access control code and and an outer error correcting code; and a modulator that modulates each encoded bit for transmission via the random access channel. In addition, the communication system includes a receiver including: a demodulator configured to demodulate received signals and provide input signals to the decoder; and a decoder configured to iteratively decode data bits received from the plurality of transmitters using message passing between an inner medium access control layer and an outer coding layer to jointly perform contention resolution and decoding.

18 Claims, 16 Drawing Sheets

(51) Int. Cl.
    *H04W 74/00* (2009.01)
    *H04L 1/00* (2006.01)

(52) U.S. Cl.
    CPC .......... *H04L 1/0028* (2013.01); *H04L 1/0042* (2013.01); *H04W 74/004* (2013.01)

(56) References Cited

U.S. PATENT DOCUMENTS

| | | | |
|---|---|---|---|
| 10,951,292 | B2 | 3/2021 | Effros et al. |
| 2006/0165190 | A1* | 7/2006 | Tamaki ................. H04L 1/1671 375/262 |
| 2007/0094580 | A1* | 4/2007 | Livshitz ................ H04L 1/0057 714/779 |
| 2007/0223620 | A1 | 9/2007 | Kalhan et al. |
| 2008/0043771 | A1 | 2/2008 | Cho et al. |
| 2008/0049685 | A1* | 2/2008 | Becker .............. H04W 72/1278 370/336 |
| 2008/0247336 | A1 | 10/2008 | Sugitani |
| 2009/0305690 | A1* | 12/2009 | Yuda ..................... H04L 1/0009 455/422.1 |
| 2011/0194478 | A1 | 8/2011 | Lee et al. |
| 2011/0216733 | A1 | 9/2011 | Han et al. |
| 2012/0117446 | A1 | 5/2012 | Taghavi Nasrabadi et al. |
| 2014/0369250 | A1 | 12/2014 | Ren et al. |
| 2015/0341146 | A1 | 11/2015 | Chunlong et al. |
| 2016/0212507 | A1 | 7/2016 | Du et al. |
| 2017/0054453 | A1 | 2/2017 | Kim et al. |
| 2017/0257195 | A1 | 9/2017 | Maaref |
| 2019/0021131 | A1* | 1/2019 | Zhang ................... H04W 76/28 |
| 2019/0245604 | A1 | 8/2019 | Effros et al. |

OTHER PUBLICATIONS

International Preliminary Report on Patentability for International Application PCT/US2019/023755, Report dated Sep. 22, 2020, dated Oct. 1, 2020, 7 Pgs.
Ahlswede, "An elementary proof of the strong converse theorem for the multiple-access channel", Journal Combinatorics, Information and System Sciences, vol. 7, No. 3, 1982, pp. 1-16.
Bassalygo et al., "Restricted Asynchronous Multiple Access", Problemy Peredachi Informatsii, vol. 19, No. 4, 1983, pp. 92-96.
Berger, "The Poisson multiple-access conflict resolution problem", Multi-user communication systems, 1981, pp. 1-27.
Blackwell et al., "The Capacity of a Class of Channels", The Annals of Mathematical Statistics, vol. 30, No. 4, Dec. 1959, pp. 1229-1241.
Blits et al., "Universal rateless coding with finite message set", Proceedings of the IEEE International Symposium on Information Theory, Cambridge, Massachusetts, Jul. 1-6, 2012, pp. 1772-1776.
Burnashev, "Data Transmission over a Discrete Channel with Feedback. Random Transmission Time", Problems of Information Transmission, vol. 12, No. 4, 1976, pp. 250-265.
Casini et al., "Contention resolution diversity slotted Aloha (CRDSA): An enhances random access scheme for satellite access packet networks", IEEE Transaction on Wireless Communications, vol. 6, No. 4, 2007, pp. 1408-1419.
Chen et al., "Capacity of Gaussian Many-Access Channels", IEEE Transactions on Information Theory, vol. 63, No. 6, Jun. 2017, pp. 3516-3539.
Chen et al., "Many-Access Channels: The Gaussian Case with Random User Activities", arXiv:1405.0893v1 [cs.IT], May 5, 2014, 5 pgs.
Csiszar et al., "Information theory and statistics: A tutorial", Commun. Inf. Theory, vol. 1, Dec. 2004, pp. 417-528.
D'Yachkov et al., "A coding model for a multiple-access adder channel", Problems of Information Transmission, vol. 17, No. 2, Apr. 1981, pp. 26-38.
Draper et al., "Efficient variable length channel coding for unknown DMCs", Proceedings of the International Symposium on Information Theory, Chicago, Illinois, Jun. 27-Jul. 2, 2004, p. 379.

Dueck, "Maximal error capacity regions are smaller than average error capacity Yegions for multi-user channels", Problems of Control and Information Theory, 1978, vol. 7, No. 1, pp. 11-19.
Dueck, "The Strong Converse of the Coding Theorem for the Multiple-access Channel", Journal of Combinatorics, Information, and System Sciences, 1981, vol. 6, pp. 187-196.
Ebrahimi et al., "Coded random access design for constrained outage", Proceedings of the IEEE International Symposium on Information Theory (ISIT), Aachen, Germany, Jun. 25-30, 2017, pp. 2732-2736.
Effros et al., "Random Access Channel Coding in the Finite Blocklength Regime", arXiv.org, Retrieved from: https://arxiv.org/pdf/1801.09018.pdf, Jul. 26, 2019, 22 pgs.
Fong et al., "A proof of the strong converse theorem for gaussian multiple access channels", IEEE Transactions on Information Theory, vol. 62, Aug. 2016, pp. 4376-4394, arXiv:1509.01380.
Gibbs et al., "On choosing and bounding probability metrics", International Statistical Review, 2002, vol. 70, No. 3, pp. 419-435.
Gudipati et al., "AutoMAC: Rateless Wireless Concurrent Medium Access", MobiCom 2012, Istanbul, Turkey, Aug. 22-26, 2012.
Hoeffding, "Asymptotically optimal tests for multinomial distributions", Annals of Mathematical Statistics, vol. 36, Apr. 1965, pp. 369-401.
Huang et al., "Finite Blocklength Coding for Multiple Access Channels", Proceedings of the IEEE International Symposium on Information Theory Proceedings, Cambridge, Massachusetts, Jul. 1-6, 2012, 5 pgs.
Huang et al., "Strong large deviations for composite hypothesis testing", 2014 IEEE International Symposium on Information Theory, Jun. 2014, pp. 556-560.
Kolmogorov, "Sulla Determinazione Empirica di una Legge di Distribuzione", Giornale dell'Istituto Italiano degli Attuari, vol. 4, 1933, pp. 83-91.
Liva, "Graph-based analysis and optimization of contention resolution diversity slotted Aloha", IEEE Transactions on Communications, vol. 59, No. 2, Feb. 2011, pp. 477-487.
Luby, "LT Codes", Proceedings of the 43rd Annual IEEE Symposium on Foundations of Computer Science, Vancouver, BC, Canada, Nov. 19, 2002, 10 pgs.
Massart, "The tight constant in the Dvoretzky-Kiefer-Wolfowitz inequality", Annals of Probability, vol. 18, Jul. 1990, pp. 1269-1283.
Minero et al., "Random Access: An Information-Theoretic Perspective", arXiv.org, Retrieved from: https://arxiv.org/pdf/0912.3264.pdf, Dec. 16, 2009.
Molavianjazi et al., "A Second-Order Achievable Rate Region for Gaussian Multi-Access Channels via a Central Limit Theorem for Functions", IEEE Transactions on Information Theory, vol. 61, No. 12, Dec. 2015, pp. 6719-6733.
Molavianjazi et al., "Simpler Achievable Rate Regions for Multi-access with Finite Blocklength", Proceedings 2012 IEEE International Symposium on Information Theory, Jul. 2012, pp. 36-40.
Moulin, "A new metaconverse and outer region for finite-blocklength MACs", Proceedings 2013 Information Theory and Applications Workshop, San Diego, Ca, Feb. 2013, pp. 1-8.
Nikopour et al., "Sparse code multiple access", IEEE 24th Annual International Symposium on Personal, Indoor, and Mobile Radio Communications, 2013, pp. 332-336.
Ordentlich et al., "Low Complexity Schemes for the Random Access Gaussian Channel", Proceedings of the IEEE International Symposium on Information Theory (ISIT), Aachen, Germany, Jun. 25-30, 2017, 10 pgs.
Paolini et al., "High throughput random access via codes on graphs: coded slotted Aloha", arXiv.org, Retrieved from: https://arxiv.org/pdf/1102.2516.pdf, Feb. 12, 2011, 6 pgs.
Polyanskiy, "A perspective on massive random-access", Proceedings of the IEEE International Symposium on Information Theory (ISIT), Aachen, Germany, Jun. 25-30, 2017, 5 pgs.
Polyanskiy, "On dispersion of compound DMCs", Proceedings of the 51st Annual Allerton Conference on Communication, Control, and Computing, Monticello, Illinois, Oct. 2-4, 2013, 8 pgs.

(56) References Cited

OTHER PUBLICATIONS

Polyanskiy et al., "Channel Coding Rate in the Finite Blocklength Regime", IEEE Transactions on Information Theory, vol. 56, No. 5, May 2010, pp. 2307-2359.

Polyanskiy et al., "Feedback in the Non-Asymptotic Regime", IEEE Transactions on Information Theory, vol. 57, No. 8, Aug. 2011, pp. 4903-4925.

Polyanskiy et al., "Lecture Notes on Information Theory", MIT (6.441), UIUC (ECE 563), Yale (STAT 664), 2012-2017, 342 pgs.

Popovski et al., "Random access protocols based on rateless codes" 2013, 7 pgs.

Richardson et al., "Design of capacity-approaching irregular low-density parity-check codes", IEEE Transaction on Information Theory, vol. 47, No. 2, 2001, pp. 619-637.

Sarwate et al., "Some observations on limited feedback for multi-access channels", IEEE International Symposium on Information Theory, Aug. 2009, pp. 394-397.

Scarlett et al., "Second-Order Rate Region of Constant-Composition Codes for the Multiple-Access Channel", IEEE Transactions on Information Theory, vol. 61, No. 1, Jan. 2015, pp. 157-172.

Shanechi et al., "Rateless Codes for MIMO Channels", IEEE, Year: 2008.

Shepp et al., "Entropy of the sum of independent bernoulli random variables and of the multinomial distribution", Contributions to Probability, Academic Press, 1981, pp. 201-206.

Shirvanimoghaddam et al., "Probabilistic rateless multple access for machine-to-machine communication", IEEE Transaction on Wireless Communications, vol. 14, No. 12, 2015, pp. 6815-6826.

Shulman, "Communication over an unknown channel via common broadcasting", PhD thesis, Tel Aviv University, 2003, 145 pgs.

Stefanovic et al., "ALOHA Random Access that Operates as a Rateless Code", arxiv.org, Retrieved from: https://arxiv.org/pdf/1308.1503.pdf, Aug. 7, 2013.

Storn et al., "Differential evolution—a simple and efficient heuristic for global optimization over continuous spaces", Global Optimization, vol. 11, No. 4, 1997, pp. 341-359.

Tan et al., "On the Dispersions of Three Network Information Theory Problems", IEEE Transactions on Information Theory, vol. 60, No. 2, Feb. 2014, pp. 881-903, arXiv:1201.3901.

Tchamkerten et al., "A Feedback Strategy for Binary Symmetric Channels", Proceedings of the IEEE International Symposium on Information Theory, Lausanne, Switzerland, Jun. 30-Jul. 5, 2002, pp. 362.

Truong et al., "On the Gaussian MAC with stop-feedback", Proceedings of the IEEE International Symposium on Information Theory (ISIT), Aachen, Germany, Jun. 25-30, 2017, pp. 2303-2307.

Wang et al., "Fountain Communication using Concatenated Codes", IEEE Transactions on communications, Feb. 2013, vol. 61, No. 2, pp. 443-454.

Zeitouni et al., "On universal hypotheses testing via large deviations", IEEE Transactions on Information Theory, vol. 37, No. 2, Mar. 1991, pp. 285-290.

Bentkus, "On the dependence of the Berry-Esseen bound on dimension," Journal of Statistical Planning and Inference, vol. 113, May 2003, pp. 385-402.

Dvoretzky et al., "Asymptotic minimax character of the sample distribution function and of the classical multinomial estimator", Annals of Mathematical Statistics, vol. 27, Sep. 1956, pp. 642-669.

Mathys, "A class of codes for a T active users out of N multiple-access communication system", IEEE Transactions on Information Theory, vol. 36, No. 6, Nov. 1990, pp. 1206-1219.

Polyanskiy, "Information theory lecture notes", Department of Electrical Engineering and Computer Science, MIT, 2012.

Roberts, "ALOHA packet system with and without slots and capture", ACM SIGCOMM Computer Communication Review, vol. 5, No. 2, Apr. 1975, pp. 28-42.

Smirnov, "Approximate laws of distribution of random variables from empirical data", Usp. Mat. Nauk., vol. 10, 1944, pp. 179-206.

Tchamkerten et al., "Variable length coding over an unknown channel", IEEE Transactions on Information Theory, vol. 52, May 2006, pp. 2126-2145.

* cited by examiner

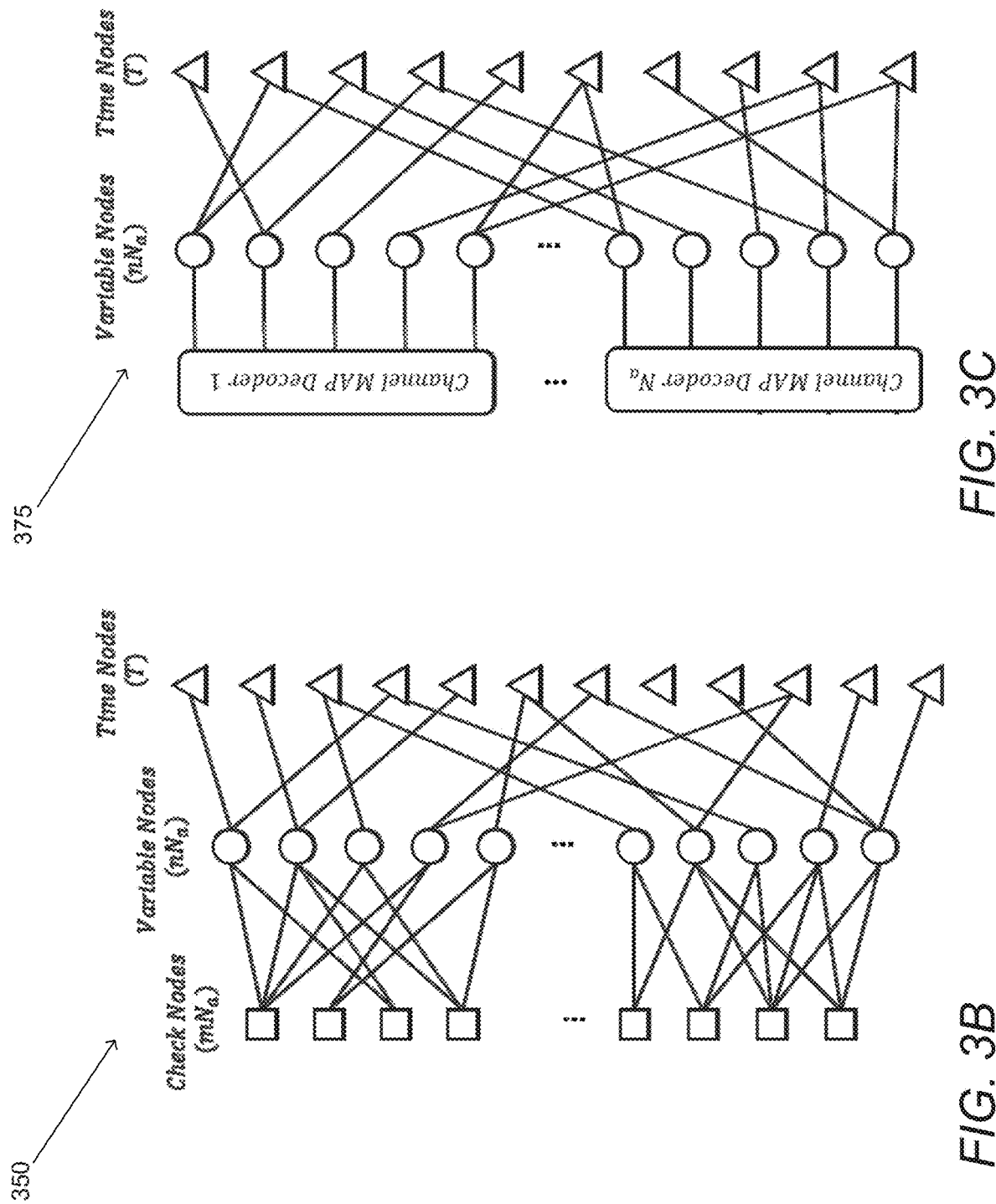

Table I: Degree Distributions of the Decoding Graph

| Symbol | Degree Distribution (Probability Mass Functions) |
|---|---|
| $\{\lambda\}/\{L\}$ | Variable edge / node perspective degree dist. in code layer |
| $\{\rho\}/\{P\}$ | Check edge / node perspective degree dist. |
| $\{\gamma\}/\{\Gamma\}$ | Variable edge / node perspective degree dist. in MAC layer |
| $\{\psi\}/\{\Psi\}$ | Time edge / node perspective degree dist. |

*FIG. 4*

Table II: Optimized Degree Distribution for the Asymptotic Setting.

| $\epsilon$ | Degree Distributions | $R_c$ | $N_b^*$ | $R_z^*$ |
|---|---|---|---|---|
| 0 | $\Gamma(x) = 0.2857x + 0.2857x^2 + 0.2286x^3 + 0.02857x^6 + 0.02857x^7 + 0.1429x^8$<br>$\lambda(x) = x$<br>$\rho(x) = x^{13}$ | 0.857 | 7 | 0.252 |
| 0.1 | $\Gamma(x) = 0.4762x + 0.4286x^4 + 0.09524x^{10}$<br>$\lambda(x) = x$<br>$\rho(x) = 0.0303x^2 + 0.00001x^7 + 0.00001x^8 + 0.09091x^9 + 0.1212x^{10} + 0.3030x^{12} + 0.3030x^{13}$ | 0.813 | 7 | 0.233 |

FIG. 6

Table III: Optimized codes and degree distributions for Reed-Muller codes up to length 128 and $\epsilon = 0.1$, $d_{max} = 13$.

| $N_a^*$ | Optimized Degree Distribution | Selected Code |
|---|---|---|
| 6 | $\Gamma(x) = 0.0313x + 0.5626x^{10} + 0.4063x^{11}$ | RM (7,5) |
| 31 | $\Gamma(x) = 0.12x + 0.36x^{10} + 0.52x^{11}$ | RM (6,5) |

FIG. 10

CODED RANDOM ACCESS MECHANISM FOR COMMUNICATION NETWORKS

CROSS-REFERENCE TO RELATED APPLICATIONS

The present invention claims priority to U.S. Provisional Patent Application Ser. No. 62/646,698 entitled "Coded Random Access Mechanism for Communication Networks" to Farshad Lahouti et al., filed Mar. 22, 2018, the disclosures of which is herein incorporated by reference in its entirety.

FIELD OF THE INVENTION

The present invention generally relates to communication systems and more specifically to communication systems that enable transmission by multiple transmitters on a random access channel.

BACKGROUND

Random access (RA) protocols are at the heart of many modern cellular standards for contention resolution over their control channels or for medium access control in wired or wireless local area networks. Almost all these protocols are developed based on variations of the slotted Aloha (SA) or carrier sense multiple access protocols, which can suffer from performance limitations. With the advent of the Internet of things and machine-to-machine communications and the scale of such networks, the overhead associated with current random access protocols when a large number of devices are attempting to transmit short messages may present a significant, performance bottleneck.

Efforts on improving the performance of SA methods include Contention Resolution Diversity Slotted Aloha (CRDSA), which replaces the concept of destructive collisions in SA by successive interference cancellation (SIC) strategies. Specifically, each user is prescribed to send its packet twice over two time-slots of a single contention frame. The receiver then detects the signals received without a collision, and subsequently removes the associated interference from time-slots in which its replica was transmitted. The process iteratively continues until all transmitted packets are recovered. The SIC can be represented by an irregular bipartite graph and users can adopt repetition rates from a given distribution for transmission of each packet. Utilizing density evolution analysis, this distribution can be optimized to maximize throughput. All the work in this domain typically assumes an error free transmission and the loss is only due to collisions that are not resolved. Since errors in the recovery of one packet will propagate and harm the SIC process, the error free assumption is typically addressed using long and low-rate channel codes.

In a number of systems, message passing algorithms between a receiver and the transmitters sharing the channel are utilized to enable multiuser detection. This is indeed the case in sparse coded multiple access systems, where each user is provided with a sparse codebook and the codewords of different users are transmitted over shared orthogonal resources, e.g., OFDM tones. Another related approach is based on analog fountain codes purposely designed for wireless fading channels.

SUMMARY OF THE INVENTION

Systems and methods in accordance with various embodiments of the invention are utilized to communicate over random access channels with erasures in which the number of users in each frame may be unknown at the transmitters, but known at the receiver. In several embodiments, the communication systems employ a two-layer coding architecture for joint contention resolution and erasure correction. In several embodiments, the receiver design employs message passing between the two layers to achieve the joint resolution of collisions and erasures. In many embodiments, the receiver estimates the number of active transmitters and coordinates selection of appropriate codes and/or code rates within the communication system to increase throughput on the shared channel. In many embodiments, the adjustment of the two-layer code utilized within the communication system increases the average user data rate achievable by each active transmitter for the given channel conditions. In several embodiments, the selected two-layer code is the optimal choice from a set of available two-layer coding schemes for the number of active transmitters and/or the observed channel conditions.

One embodiment of the communication system includes:
  a plurality of transmitters configured to transmit signals via a random access channel, where each transmitter comprises:
    an encoder configured to encode a packet of data bits using a two-layer code comprising an inner medium access control code and and an outer error correcting code, where encoding a packet of data bits using the two-layer code comprises:
      encoding a packet of user data bits using an error correcting code to obtain encoded bits;
      selecting a repetition rate for each encoded bit; and
      selecting a subset of bit intervals on which to transmit each encoded bit at its selected repetition rate; and
    a modulator configured to modulate each encoded bit at its selected repetition rate for transmission via the random access channel during the selected subset of bit intervals;
  a receiver configured to receive transmitted signals from the plurality of transmitters via the random access channel, wherein the receiver comprises:
    a demodulator configured to demodulate received signals and provide input signals to the decoder; and
    wherein the decoder is configured to:
      iteratively decode packets of user data bits received from the plurality of transmitters using message passing between an inner medium access control layer and an outer coding layer to jointly perform contention resolution and decoding of user data bits from the input signals received from the demodulator; and
      output decoded packets of user data.

As can readily be appreciated, communication systems in accordance with many embodiments of the invention employ symbol constellations in which multiple bits map to each symbol (i.e. the cardinality of the constellation is greater than two). In embodiments in which multiple bits map to each transmitted symbol, the repetition rate can be determined for each encoded symbol and the modulator selects a subset of symbol intervals on which to transmit each encoded symbol at is selected repetition rate. By extension, bit intervals can be considered to be symbol intervals of systems that employ a binary symbol constellation. Accordingly, communication systems in accordance with various embodiments of the invention are in no way limited to any specific modulation scheme and/or constellation cardinality.

In a further embodiment of the invention, each encoder is configured to select a repetition rate for each encoded bit based upon channel conditions.

In another embodiment of the invention, the selected repetition rate for at least one of the encoded bits is greater than one.

In a still further embodiment, the error correcting code is a Low Density Parity Check Code.

In still another embodiment, the decoder includes a set of check nodes, a set of time nodes, and a set of variable nodes and the decoder performs a decoding iteration starting with the medium access control layer by: the set, of time nodes sending messages containing their estimates of the values of the variable nodes to the set of variable nodes; and updating values at the set of variable nodes based upon the received messages from the set of time nodes. The decoder continues the decoding iteration by performing a round at the code layer including: the set of variable nodes sending their updated values to the set of check nodes; the set of check nodes sending messages containing their estimates of the values of the variable nodes to the set of variable nodes; and further updating values at the set of variable nodes based upon the received messages from the set of check nodes. The decoder completes the decoding iteration at the medium access control layer by the set of variable nodes sending their further updated values to the set of time nodes.

In a yet further embodiment, the decoder continues to iterate until a stopping criterion is reached.

In yet another embodiment, the error correcting code is a short block-length code.

In a further embodiment again, the decoder includes a set of decoders, a set of time nodes, and a set of variable nodes and the decoder performs a decoding iteration starting with the medium access control layer by: the set of time nodes sending messages containing their estimates of the values of the variable nodes to the set of variable nodes; and updating values at, the set of variable nodes based upon the received messages from the set of time nodes. The decoder continues the decoding iteration by performing a round at the code layer including: the set of variable nodes sending their updated values to the set of decoders; the set of decoders sending messages containing their estimates of the values of the variable nodes to the set of variable nodes; and further updating values at the set of variable nodes based upon the received messages from the the set of decoders. The decoder completes the decoding iteration at the medium access control layer by the set of variable nodes sending their further updated values to the set of time nodes.

In another embodiment again, the decoder continues to iterate until a stopping criterion is reached.

In a further additional embodiment, prior to commencement of a frame, the receiver is configured to: determine a number of the plurality of transmitters expected to actively transmit during the frame; and specify code parameters for the two-layer code utilized by the plurality of transmitters when transmitting during the frame based upon the number of the plurality of transmitters expected to actively transmit during the frame. In addition, the plurality of transmitters that actively transmit during the frame are configured to encode packets of user data using the code parameters for the two-layer code specified by the receiver.

In another additional embodiment, the code parameters for the two-layer code comprise at least one code parameter selected from the group consisting of: a code book; a pattern of bit or symbols intervals used to select a subset of bit intervals or a subset of symbol intervals on which to transmit each encoded bit or each encoded symbol at its selected repetition rate; and a repetition rate for an encoded bit or an encoded symbol.

In a still yet further embodiment, the receiver further comprises a transmitter configured to transmit control messages that specify code parameters for the two-layer code utilized by the plurality of transmitters, and each transmitter further comprises a receiver configured to receive control messages transmitted by the receiver.

In still yet another embodiment, the control messages further comprise a beacon message indicating a start of the frame.

An embodiment of a transmitter system includes:
a receiver configured to receive a control message indicating a set of code parameters for a two-layer code;
an encoder configured to encode a packet of data bits using a two-layer code comprising an inner medium access control code and and an outer error correcting code, where encoding a packet of data bits using the two-layer code comprises:
  encoding a packet of user data bits using an error correcting code to obtain encoded bits in accordance with the set of code parameters;
  selecting a repetition rate for each encoded bit in accordance with the set of code parameters; and
  selecting a subset of bit intervals on which to transmit each encoded bit at its selected repetition rate; and
a modulator configured to modulate each encoded bit at its selected repetition rate for transmission via the random access channel during the selected subset of bit intervals.

In a further embodiment, the receiver is further configured to receive a beacon message indicating a start of a frame.

An embodiment of a receiver system configured to receive transmitted signals from a plurality of transmitters via a random access channel includes:
a demodulator configured to demodulate received signals and provide input signals to a decoder; and
  wherein the decoder is configured to:
  iteratively decode packets of user data bits received from a plurality of transmitters using message passing between an inner medium access control layer and an outer coding layer to jointly perform contention resolution and decoding of user data bits from the input signals received from the demodulator; and
  output decoded packets of user data.

In a further embodiment, the outer coding layer utilizes an iterative error correcting code, the decoder comprises a set of check nodes, a set of time nodes, and a set of variable nodes, and the decoder performs a decoding iteration starting with the medium access control layer by: the set of time nodes sending messages containing their estimates of the values of the variable nodes to the set of variable nodes; and updating values at the set of variable nodes based upon the received messages from the set of time nodes. The decoder continues the decoding iteration by performing a round at the code layer including: the set of variable nodes sending their updated values to the set of check nodes; the set of check nodes sending messages containing their estimates of the values of the variable nodes to the set of variable nodes; and further updating values at the set of variable nodes based upon the received messages from the set of check nodes. The decoder completes the decoding iteration at the medium access control layer by the set of variable nodes sending their further updated values to the set of time nodes.

In another embodiment, the outer coding layer uses a short block-length code error correcting code, the decoder comprises a set of decoders, a set of time nodes, and a set of variable nodes, and the decoder performs a decoding iteration starting with the medium access control layer by: the set of time nodes sending messages containing their estimates of the values of the variable nodes to the set of variable nodes; and updating values at the set of variable nodes based upon the received messages from the set of time nodes. The decoder continues the decoding iteration by performing a round at the code layer including: the set of variable nodes sending their updated values to the set of decoders; the set of decoders sending messages containing their estimates of the values of the variable nodes to the set of variable nodes; and further updating values at the set of variable nodes based upon the received messages from the the set of decoders. The decoder completes the decoding iteration at the medium access control layer by the set of variable nodes sending their further updated values to the set of time nodes.

In a still further embodiment, the receiver is configured to: determine a number of transmitters expected to actively transmit during the frame; and specify code parameters for a two-layer code utilized by active transmitters when transmitting during the frame based upon the number of transmitters expected to actively transmit during the frame.

In still another embodiment, the receiver further includes a transmitter configured to transmit control messages that specify code parameters for a two-layer code.

BRIEF DESCRIPTION OF THE DRAWINGS

FIG. 3B conceptually illustrates a factor graph of the receiver in the case of using LDPC codes in a code layer with message passing decoding between the code layer and a MAC layer in accordance with an embodiment of the invention.

FIG. 3C conceptually illustrates a factor graph of a decoder that uses multiple individual decoders in a code layer with message passing decoding between the code layer and a MAC layer in accordance with an embodiment of the invention.

FIG. 4 presents Table 1, which summarizes the edge and node-perspective degree distributions for decoding graphs of decoders implemented in accordance with various embodiments of the invention.

FIG. 6 presents Table 2, which shows input load thresholds corresponding to optimized degree distributions for target loads.

FIG. 10 presents Table 3, which lists the optimized codes and degree distributions using linear approximation and Reed-Muller codes up to length 128.

DETAILED DESCRIPTION

Figure 1A:
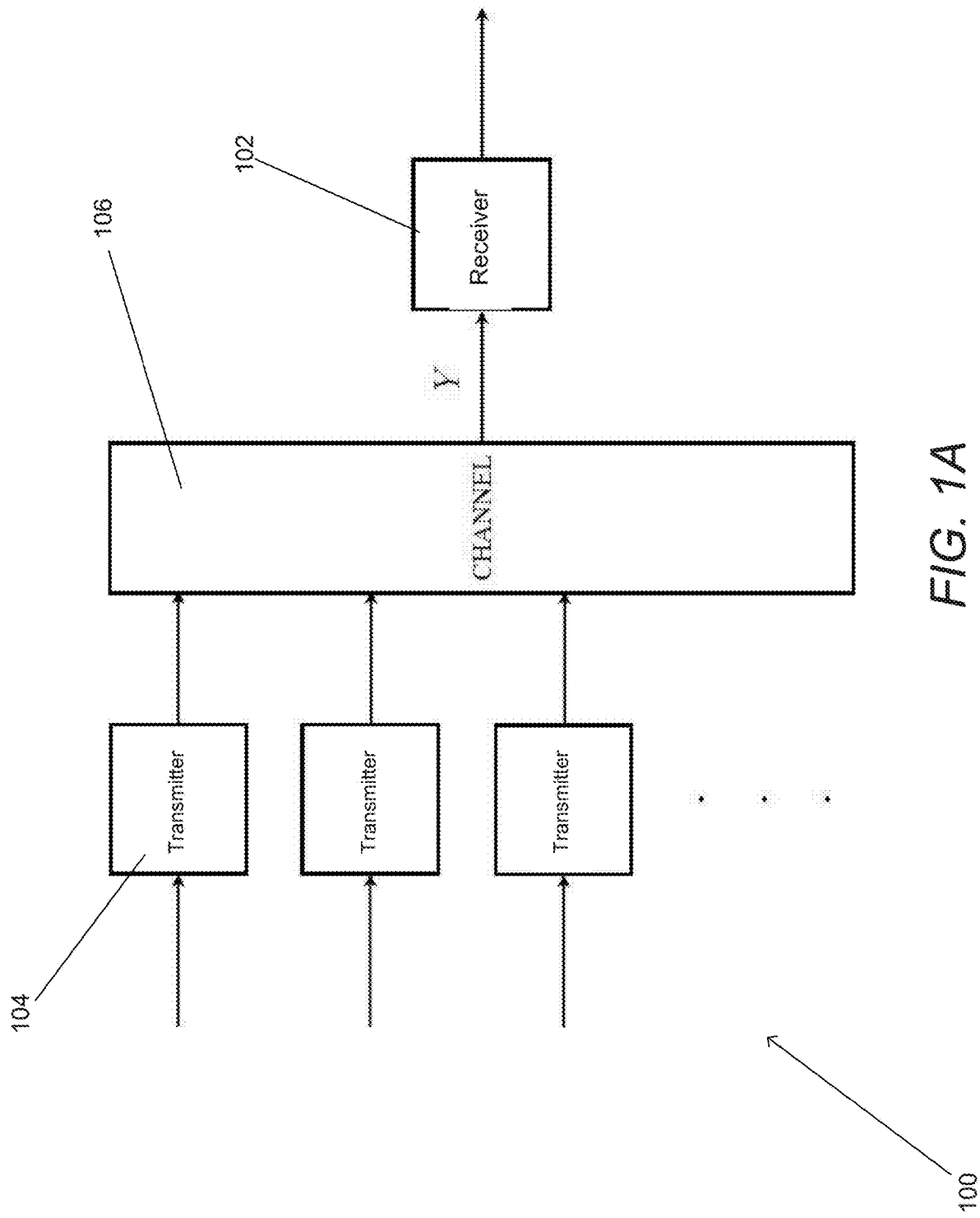
FIGS. 1A and 1B conceptually illustrate a random access system in accordance with an embodiment of the invention.

Turning now to the drawings, systems and methods for coded access communication in accordance with various embodiments of the invention are illustrated. Systems and methods in accordance with many embodiments of the invention utilize a two-layer codes access scheme when communicating over a binary adder access channel with erasures. As can readily be appreciated, this channel model is also appropriate for binary signaling over a noisy channel, where a received signal with low reliability may be interpreted as erasure.

Two-layer coded access schemes in accordance with various embodiments of the invention can utilize an inner layer that is intended to resolve collisions and an outer layer that targets erasures. The layers can operate in lockstep while passing messages back and forth, which results in the ability of the receiver to perform joint resolution of collisions and erasures. In a number of embodiments, the communication system is utilized in a multiple access scenario where the number of users within a frame is known at the transmitter and the receiver. In several embodiments, the number of users within a frame is information that is only known by the receiver.

In many embodiments, the system utilizes a receiver in which the MAC layer and the code layer cooperate by iteratively passing messages back and forth to achieve joint resolution of collisions and erasures. As is discussed further below, the use of message passing within a two-layer access scheme can significantly increase the average per user data rate of the communication system with an acceptable increase in the complexity of the receiver. In many embodiments, the proposed message passing decoder for the two-layer coded access scheme offers a linear complexity as a function of number of users and node degrees and approaches the capacity of the corresponding channels.

In many embodiments, the code parameters in both layers can be optimized to improve the overall throughput of the communication system. In certain embodiments, one layer is fixed (e.g. a specific error correction code is specified for use in a standard) and the other layer is optimized with respect to the fixed layer. Systems and methods in accordance with various embodiments of the invention are capable of using LDPC and/or short block length codes. Furthermore, the codes employed by the communication system are able to be selected/optimized both for the case of long codes and short (algebraic) codes. In certain embodiments, the receiver coordinates adjustments of the code parameters based upon an observed and/or expected number of active transmitters and/or observed channel conditions. In several embodiments, the adjustments coordinated by the receiver increase channel throughput. In many embodiments, the adjustments increase the average achievable user data rate. In certain embodiments, the adjustments involve selection of code rate parameters from a set of different code rate parameter combinations, where the selection is the optimum selection given the observed and/or expected number of active transmitters and possibly additional constraints.

In a number of embodiments, the communication system utilizes LDPC codes of large block-length and algebraic codes of short block-length to implement a two-layer access scheme. Optimization of systems that utilize long codes demonstrates the ability to achieve superior performance in comparison to the capacity of an equivalent orthogonal MAC, and other related prior art systems. With an imposed complexity constraint, coding schemes in accordance with various embodiments of the invention that employ large block-lengths such as (but not limited to) LDPC codes: (i) surpass the performance of an equivalent perfect orthogonal transmission scheme; (ii) approach the outage capacity of the binary adder random access channel, and (iii) noticeably outperform previous benchmarks, in which the two layers are designed and operate separately.

In certain embodiments, short block-length codes can be utilized as an alternative to longer iterative codes. Optimization with short codes can be enabled through the use of an efficient approximation of the decoding performance of a candidate code using its parity check matrix. In the case of algebraic codes of short block-length, the results show that as the number of transmitters increases, their performance gap with codes of large block-length in the context of two-layer coded access schemes rapidly declines.

Communication systems and methods that utilize two-layer coded access schemes and receivers that employ message passing between a MAC layer and a code layer to enable joint resolution of collisions and erasures in accordance with various embodiments of the invention are discussed further below.

Random Access System

Figure 1B:
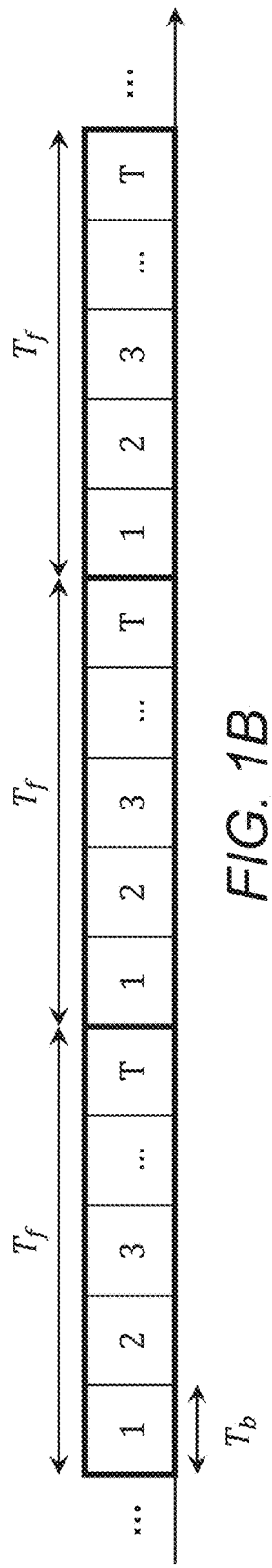

A random access system in accordance with an embodiment of the invention is conceptually illustrated in FIGS. 1A and 1B. In many embodiments, a random access (RA) system 100 is utilized including one receiver (base station) 102 and a total of N transmitters 104 that share a communication channel 106. Time on the shared communication channel can be divided into contention frames of length $T_f$, which include T bit intervals of length $T_b$, hence $T_f = T*T_b$. Each transmitter 104 can be considered to participate in a frame with the probability $p_a$. Under this assumption, each contention frame can be considered to include a random number of active senders. By assuming a large number of transmitters N and a low activity probability $p_a$, the number of active transmitters in a frame, $N_a$, can be assumed to follow a Poisson distribution with parameter $Np_a$. As can readily be appreciated, a variety of probability distributions can be assumed with respect to the number of active transmitters as appropriate to the requirements of specific applications in accordance with various embodiments of the invention.

The packets transmitted by the transmitters 104 can be variable length or assumed to be of equal size (i.e. k bits) and sent randomly on T available bit intervals in a frame, leading to a common transmission rate of $R_t = k/T$ bits per user per bit interval. In a number of embodiments, each active transmitter first encodes its k bit packet into n bits (k<n) and then transmits them over T bit intervals with possible repetitions (T≥n) according to a random but fixed pattern. Furthermore, self-collisions are not allowed, however, different transmitters can use the same bit intervals. As discussed further below, the manner in which the transmitters 104 encode the user data is determined based upon a two-layer coded access system employed by the communication system 100. The two-layer coded access system enables the receiver 102 to handle both collisions and erasures.

In several embodiments, the receiver 102 is assumed to know both the set of active transmitters and their transmission patterns (location of their bits) in the frame. Indeed, these transmission patterns may be agreed upon between the transmitters 104 and the receiver 102 in a setup and the receiver can adjust the code parameters based upon changes in the number of active transmitters and/or the channel conditions. Ideas on practical ways to handle such issues are presented in Shirvanimoghaddam, Mahyar, et al. "Probabilistic rateless multiple access for machine-to-machine communication." IEEE Transactions on Wireless Communications 14.12 (2015): 6815-6826, the disclosure of which including the disclosure relevant to techniques for determining a number of active transmitters and/or their transmission patterns at a receiver is hereby incorporated by reference herein in its entirety. In a number of embodiments, the transmitters are only aware of when a new contention frame starts and are unaware of the number of other active transmitters. They do not receive any other feedback from the base station or other transmitters. In practice, frame synchronization in an RA system is typically facilitated by the transmission of beacon messages by the receiver to mark the start of a frame. Accordingly, while not shown in FIG. 1A, each receiver may include a transmitter for broadcasting control messages and each transmitter may include a receiver for receiving control messages and/or adjusting code parameters utilized in the encoding of transmitted data in response to the control messages received from the receiver.

While various communication systems are described above with reference to FIG. 1, any of a variety of communication systems that employ a RA channel can be utilized as appropriate to the requirement of specific applications in accordance with various embodiments of the invention. In much of the discussion that follows, the operation of systems and methods in accordance with various embodiments of the invention is considered in the context of bit intervals and bit transmissions. Systems and methods in accordance with many embodiments of the invention can, however, operate in a more general manner involving timeslots, bit sequences, and/or symbols. Furthermore, as can readily be appreciated, systems and methods in accordance various embodiments of the invention can also be utilized within a communication system in which the number of active transmitters is known to one or more of the transmitters within the communication system. Prior to discussing transmitters and receivers employed in communication systems that employ two-layer coded access systems in accordance with various embodiments of the invention, however, an overview of the a binary adder random access channel model is discussed below.

Binary Adder Random Access Channel Model

The operation of systems and methods in accordance with many embodiments of the invention can be considered in the context of a binary adder random access channel with erasures, with output $r \in \{0, 1, 2, \ldots, N\} \cup \{e\}$ given by $$r = \begin{cases} \sum_{i=1}^{N_a} x_i, & \text{with probability } 1 = \epsilon \\ e, & \text{with probability } \epsilon \end{cases} \quad (1)$$

where, as before, $N_a$ is the (random) number of active transmitters in a frame, $x_i \in \{0, 1\}$, $1 \leq i \leq N_a$, are the input bits, and e designates an erasure. This simple channel models the situation in which a digital encoder and decoder communicate over an analog channel via modulator/demodulator; the modulator converts bits to analog signals under a power constraint; and the demodulator, having observed a sum of the signals from all the transmitters and a random thermal noise, digitizes it by simple quantization. If the demodulator deems the received signal too noisy to digitize reliably, it declares an erasure and passes it on to the coding layer to resolve.

For concreteness, consider BPSK modulation in the proposed coded random access setting. In high SNR regime with $N_a$ users, the output of the demodulator $\bar{r}$ is in $\{-N_a, -N_a+2, \ldots, N_a-2, N_a\}$. A simple transformation $r=(\bar{r}+N_a)/2$ converts the received signal in each slot to $r \in \{0, 1, 2, \ldots, N_a\}$. As described above, in presence of noise, the received signal can be considered as erased when the demodulator cannot reliably detect the received symbol; hence we have $r \in \{0, 1, 2, \ldots, N_a\} \cup \{e\}$. This is precisely the binary adder channel model presented in (1). For QPSK, as an example of higher order modulations, real and imaginary parts can be treated as in the BPSK case, with one variable node and one time node now dedicated to real and imaginary parts of the received symbols at the decoder. Accordingly, as can readily be appreciated, systems and methods in accordance with various embodiments of the invention are not limited to specific modulation schemes.

Regardless of the number of active users $N_a$, due to the symmetry of the channel in (1), its capacity-achieving distribution is Bernoulli(½), and the sum-rate capacity (for $N_a$ active users) is $$C_{N_a} = (1 - \epsilon)\left( N_a - \frac{1}{2^{N_a}} \sum_{i=0}^{N_a} \binom{N_a}{i} \log_2 \binom{N_a}{i} \right) \quad (2)$$

If the number of active users $N_a$ is random but stays constant within a contention frame, the outage capacity is an appropriate performance measure:

$$C_p = \max\{R_t : \mathbb{P}[C_{N_a} < N_a R_t] \leq p\}, \quad (3)$$

where p is the outage probability, i.e. the probability that the system cannot support the target rate $R_t$ given the randomness in the number of active users $N_a$. While two-layer coded access schemes in accordance with various embodiments of the invention can be utilized within and optimized for other channels, the channel model described above is helpful in evaluating the performance of communication systems that utilize two-layer coded access schemes in accordance with various embodiments of the invention in real world RA channels.

Two-Layer Coded Access Scheme

As noted above, systems and methods in accordance with many embodiments of the invention employ a two-layer coded access scheme including a receiver front-end dealing with collisions and an error correcting code dealing with erasures. These two layers run iteratively and update each other, enabling joint contention resolution and decoding of messages. The front-end of the receiver can be referred to as the MAC layer and the error correcting code can be referred to as the code layer. As is discussed below, a variety of options exists with respect to the implementation of the MAC layer and the coding layer including (but not limited to) the choice of the particular type/block length of the code employed within the coding layer.

Encoder/Transmitter

Figure 2A:
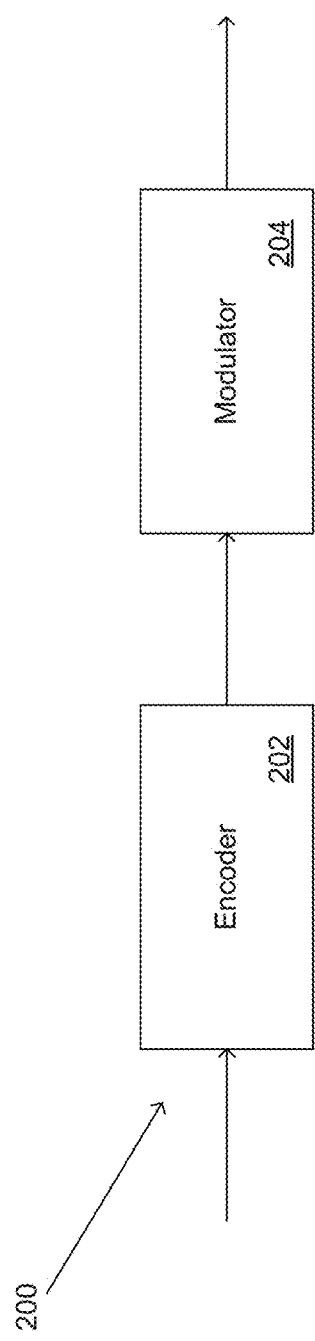
FIG. 2A conceptually illustrates a transmitter in accordance with an embodiment of the invention.

A transmitter 200 in accordance with an embodiment of the invention is conceptually illustrated in FIG. 2A and includes an encoder 202 and a modulator 204. As noted above, a transmitter may also include a receiver (not shown) for receiving command messages from the receiver that coordinate the codes and/or code parameters employed by the encoder 202. The encoder 202 encodes user data in accordance with the two-layer coded access system utilized by a communication system and the modulator 204 modulates the encoded bits for transmission by a shared RA communication channel.

Figure 2B:
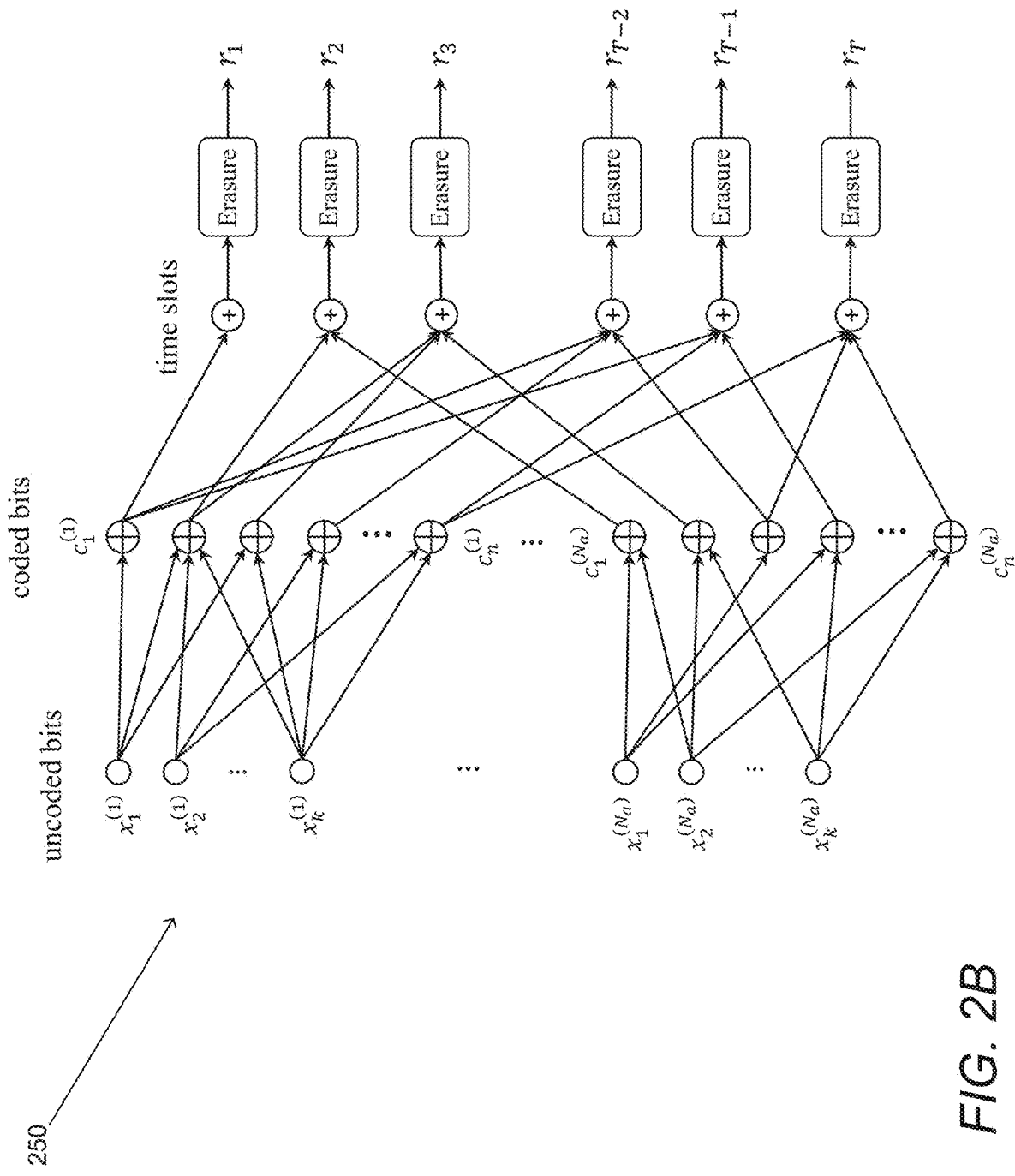
FIG. 2B conceptually illustrates multiple transmitters sharing a random access channel within a two-layer coded access system in accordance with an embodiment of the invention.

FIG. 2B conceptually illustrates multiple $N_a$ encoders that are utilized to transmit data using $N_a$ modulators over a random access channel within a two-layer coded access system and a demodulator, which produces the received digits $r_1, \ldots, r_T$, in accordance with an embodiment of the invention. With specific regard to the jth sender, the encoder uses an error correcting code with rate $R_c = k/n$ to encode its k-bit packet $x^{(j)}$ to create n coded bits $c^{(j)}$. Then for each coded bit $c_i^{(j)} \in \{0, 1\}$, $1 \leq i \leq n$, the transmitter independently of previous choices generates a random repetition rate $d_i^{(j)}$ according to the probability mass function $\{\Gamma\}$. Afterwards, a subset of $d^{(j)} = \Sigma_i d_i^{(j)}$ out of T bit intervals are randomly selected, and each coded bit $c_i^{(j)}$ is sent on $d_i^{(j)}$ different intervals of this set. Each transmitter uses a bit interval at most once in a frame. The MAC layer rate can be defined as $R_m = n/T$. Therefore, the common per-user rate $R_t$ can be expressed in terms of code and MAC layer rates:

$$R_t = k/T = R_c R_m \quad (4)$$

From (1), it is clear that the received value on a bit interval is the summation of coded bits sent on that interval from different transmitters, which could be erased with probability $\epsilon$.

In a number of embodiments, a low-density parity check (LDPC) code from the ensemble $C(n, \lambda, \rho)$ with design rate of $R_c$ for the code layer is utilized to encode the encoded bits. Refer to Table 1 for definition of parameters. As can readily be appreciated, other iterative error correcting codes can fit the two-layer framework. On the other hand, in delay-sensitive applications, or in the presence of processing power constraints, using long codes is not feasible. In general, many applications in machine-type communications and IoT fit this case. Therefore, systems and methods in accordance with many embodiments of the invention optimize the proposed two-layer system using an ensemble of classic linear block codes for the code layer. In light of various constraints specific applications can place upon the code layer, communication system in accordance with various embodiments of the invention can employ any code appropriate to the requirements of a given application. The selection of the code parameters for two-layer coded access systems that utilize different exemplary codes in accordance with various embodiments of is invention are discussed further below.

Decoder/Receiver

Figure 3A:
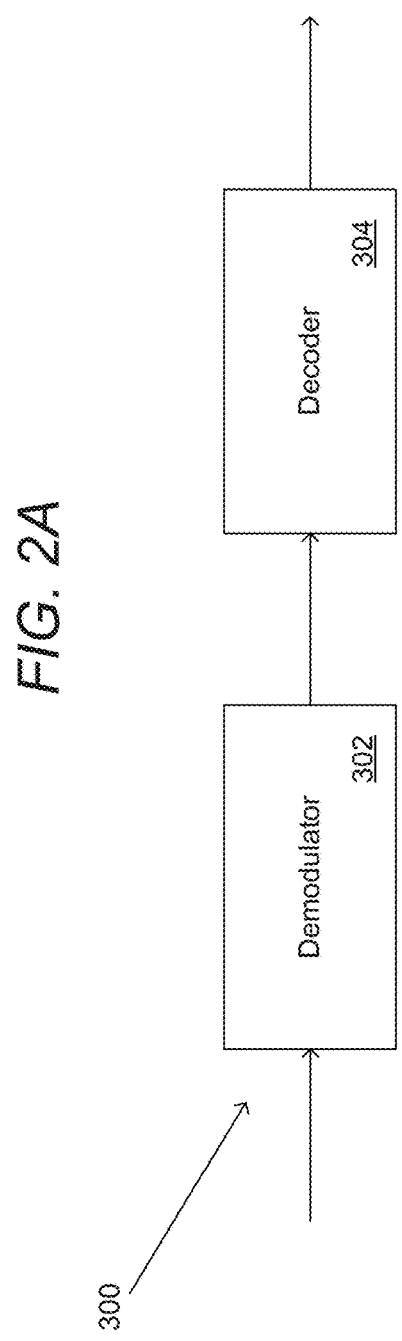
FIG. 3A conceptually illustrates a receiver in accordance with an embodiment of the invention.

As mentioned earlier, the receiver includes a front-end for contention resolution and channel decoders for dealing with erasures imposed by the channel. Message passing is performed on the decoder's factor graph to recover the value of the variable nodes. A receiver 300 in accordance with an embodiment of the invention is conceptually illustrated in FIG. 3A. The receiver includes a demodulator 302, which demodulates received signals and a decoder 304 that is responsible for decoding and outputting user data bits using knowledge of the two-layer coded access scheme utilized by the communication system. As noted above, the receiver may also include a transmitter (not shown) for broadcasting control messages including (but not limited to) beacon messages to synchronize frames and code parameter coordination messages used to adapt the codes and/or code parameters/rates utilized to transmit data within the communication system.

FIG. 3B conceptually illustrates a factor graph of the receiver in the case of using LDPC codes with message passing decoding. FIG. 3C conceptually illustrates a factor graph of the receiver using classic codes with MAP decoding and message passing. In many embodiments, messages passed on the edges of the decoder's graph are either e, meaning the value of the variable node has not been recovered yet, or they are 0 or 1, reflecting the value of the associated variable node.

For each node in a layer, a node-perspective and an edge-perspective degree distribution can be defined. The former determines the fraction of nodes with different degrees, while the latter specifies the fraction of edges connected to nodes with specified degrees. Polynomial representation of a node-perspective degree distribution $A=\{A_0, A_1 \ldots, A_d\}$ can be defined as $A(x)=\Sigma_{i=0}^{d} A_i x^i$, while for an edge-perspective degree distribution $a=\{a_1, a_2, \ldots, a_d\}$, the polynomial form can be expressed as $a(x)=\Sigma_{i=1}^{d} a_i x^{i-1}$. In addition, the edge-perspective polynomial can be obtained by the normalized derivative of the node-perspective polynomial. Table 1 shown in FIG. 4 summarizes the edge and node-perspective degree distributions for the decoding graph.

The processing rule at a time node of degree d with input messages $m_i$, $1 \leq i \leq d-1$, and a received value of r is $$f_T = \begin{cases} 0, & r = \sum_{i:m_i \neq e} m_i \\ 1, & r = 1 + \sum_{i:m_i \neq e} m_i + \sum_{i:m_i = e} 1 \\ e, & \text{otherwise} \end{cases} \quad (5)$$

Equation (5) states that a time node can recover the unknown bits whenever there is no other choice for them except being all zeros or all ones. Note that the message sent from an erased time node is always e.

For the code layer, depending on the application, LDPC codes or short linear block codes can be used. While a variety of encoder and decoder configurations are described above with respect to FIGS. 2A-3C, any of a variety of transmitters and receivers can be utilized within communication systems in accordance with various embodiments of the invention according to the requirements of specific applications and/or the MAC and/or coding layers employed within the two-layer coded access scheme employed within the communication system.

Using LDPC Codes

FIG. 3B shows the factor graph 350 of a decoder that utilizes LDPC codes in accordance with an embodiment of the invention, which can be obtained by combining $N_a$ Tanner graphs of the senders' LDPC codes to the transmission graph of the coded bits. Both layers use message passing decoding on bipartite graphs. Check nodes of the LDPC Tanner graphs (designated by squares) and time nodes (triangles) are the function nodes, and bit nodes (circles) are the variable nodes in this graph.

The $N_a$ LDPC decoders behave in a manner similar to standard erasure decoders, i.e., the output message of a check node equals the modulo-2 sum of its input messages, if none of them is e.

$$f_C = \begin{cases} \sum_{i=1}^{d-1} m_i, & \forall i \in \{1, 2, \ldots, d-1\} : m_i \neq e \\ e, & \text{otherwise} \end{cases} \quad (6)$$

On the other hand, since the erasure channel does not change received values but erases them, the non-erased input messages to a bit node are expected to agree. Therefore, when the value of a bit node is recovered from a time node or a check node equation, it equals the real value sent by the transmitter. As a result, the outgoing message from a variable node is e if all the input messages are erased; otherwise, it equals the same non-erased value of the input messages.

$$f_V = \begin{cases} m, & \exists i \in \{1, 2, \ldots, d-1\} : m_i = m \neq e \\ e, & \text{otherwise} \end{cases} \quad (7)$$

While the discussion above relates to LDPC codes, as can readily be appreciated, any of a variety of iterative and/or capacity approaching codes can be utilized to implement a two-layer access system as appropriate to the requirements of specific applications in accordance with various embodiments of the invention.

Using Short Classic Codes

FIG. 3C conceptually illustrates the factor graph 375 of a decoder that uses $N_a$ individual decoders for the code layer in accordance with an embodiment of the invention. The architecture in general can accommodate different individual decoders for the short codes. In several embodiments, block map decoders are utilized. As can readily be appreciated any of a variety of codes appropriate to the requirements of a specific application can be utilized. In the illustrated embodiment, each Maximum A Poteriori (MAP) decoder, depending on the erasure pattern of the input codeword, either recovers all the erased bits or fails to recover any of them. As can readily be appreciated, any of a variety of decoders can be utilized to recover erased bits as appropriate to the requirements of a given application.

Design, Operation and Complexity Considerations

As the transmitters select bit intervals based upon a code design that specifies a transmission pattern known to the receiver, the time node degree distribution $\{\Psi\}$ cannot be designed directly and is obtained from repetition rate distribution of variable nodes, i.e., $\{\Gamma\}$. In many instances, the selected repetition rates and/or transmission pattern are determined based upon the channel characteristics of the random access channel and/or any other factors relevant to a particular application.

The probability that the jth transmitter selects a bit interval is $d^{(j)}/T$, where $d^{(j)}=\Sigma_{i=1}^{n} d_i^{(j)}$ is the total number of transmissions for sender j. As the code length grows, according to the law of large numbers:

$$\frac{1}{n}d^{(j)} \to \mathbb{E}\{d_i^{(j)}\} = \sum_i i\Gamma_i = \Gamma'(1),$$

where $\Gamma(.)$ is the polynomial representation of the repetition rate distribution. Hence, the degree of time nodes follows a binomial distribution:

$$\{\Psi\} \sim B\left(N_a, \frac{n}{T}\Gamma'(1)\right) = B(N_a, R_m\Gamma'(1)). \tag{8}$$

With LDPC codes, the decoding complexity is determined by the total number of edges in the decoder's graph, as the number of operations at each node has a linear relationship with its degree. The number of edges in the code layer and the MAC layer graph are $nN_a\Sigma_i iL_i$ and $nN_a\Sigma_i i\Gamma_i$, respectively. Hence, the complexity of decoding in one iteration is $O(nN_a\Sigma_i i(L_i+\Gamma_i))=O(nN_a(\Gamma'(1)+L'(1)))$. Overall, for the proposed decoder, the complexity remains linear in terms of the number of active users, code length and maximum degree of nodes. In the case of short codes, the decoding complexity depends on that of the individual decoders. Still the share of the complexity due to the MAC layer remains the same.

A specific setting in this architecture, for $N_a=2$ and $R_m=1$, known as two-user joint iterative decoding, is discussed in academic literature for Gaussian and binary adder multiple access channels. This is equivalent to code design for a fixed transmission scheme. In general, the proposed two-layer architecture introduces an additional degree of freedom in system design and enables joint optimization of the code and transmission strategy. This in turn provides wider design trade-offs for complexity and user and system rate and performance, which are discussed further below.

In a number of embodiments, the definition of the decoder is finalized by the specification of a schedule. In many decoders, a decoding iteration starts with the MAC layer; the time nodes send their values to the variable nodes. Then a decoding round at the code layer is performed, where the variable nodes send their updated values to the check nodes (case of LDPC) or to the (MAP) decoders (case of short codes) and receive the answers. The variable nodes send their updated values to the time nodes. This concludes a decoding iteration. The decoder can continue to iterate until a stopping criterion is reached such as (but not limited to) either no new bit node is recovered during an iteration, or a maximum number of iterations is reached.

Asymptotic Analysis of Decoding Threshold—LDPC Codes

Like other message-passing decoders, decoders in accordance with various embodiments of the invention exhibit threshold behaviors for infinitely large code and frame lengths. The threshold can be determined both by the channel erasure probability and the input load. More accurately, under the assumption of asymptotically large code and frame length, if the number of active transmitters does not exceed $N_a^*$ and the erasure probability is less than $\epsilon^*$, the receiver is able to recover message bits completely as long as the per-user rate is less than the threshold, $R_t^*(N_a^*, \epsilon^*)$. An equivalent characterization of the decoding threshold is the maximum load sustainable by the system that is compatible with a given rate and erasure probability, $N_a^*(R_t^*, \epsilon^*)$. The decoding performance of the receiver can be analyzed in an asymptotic setting. Density evolution (DE) offers a tool to calculate the average performance of a code ensemble in each iteration under the assumption of infinite code length. Under this assumption, the decoding graph becomes a tree, which implies the independence of incoming messages to a node. In order to conduct the analysis, the erasure probability transfer function of each node is derived. Then, a set of equations is introduced to recursively track the erasure probability in each iteration.

Erasure Transfer Function of Nodes

The probability $P_{out}$ that the output message of a node equals e can be found given the erasure probability of input messages $p_{in}$. Under the assumption of infinite code and frame lengths, all messages entering a node are independent, since there is no loop in the decoding graph of the receiver.

From the standard density evolution of erasure correcting LDPC codes, the following can be obtained for the check and variable nodes:

$$P_{out,c}=1-\rho(1-p_{in}) \tag{9}$$

$$P_{out,v}=\lambda(p_{in}). \tag{10}$$

For time nodes with the processing rule in (5), Proposition 1 presents the transfer function.

Proposition 1. Erasure transfer function of a time node is described by $$P_{out,t} = 1 - (1-\epsilon)\psi\left(1 - \frac{p_{in}}{2}\right) \tag{11}$$

Tracking Decoder Erasure Probability

Having derived the erasure probability transfer function of the nodes, the erasure probability of a specific message along different iterations for fixed $N_a$ and $\epsilon$ can be tracked. This is done by stating the erasure probability of a message in terms of its value in the previous iterations. In the following, the message sent from the node a to the node b in the $l^{th}$ iteration is denoted by $m_{ab}^{(l)}$. $P_{ab}^{(l)}$ is the probability that $m_{ab}^{(l)}$ equals e, where a and b can stand for v (for variable nodes), c (for check nodes), and t (for time nodes).

Figure 5:
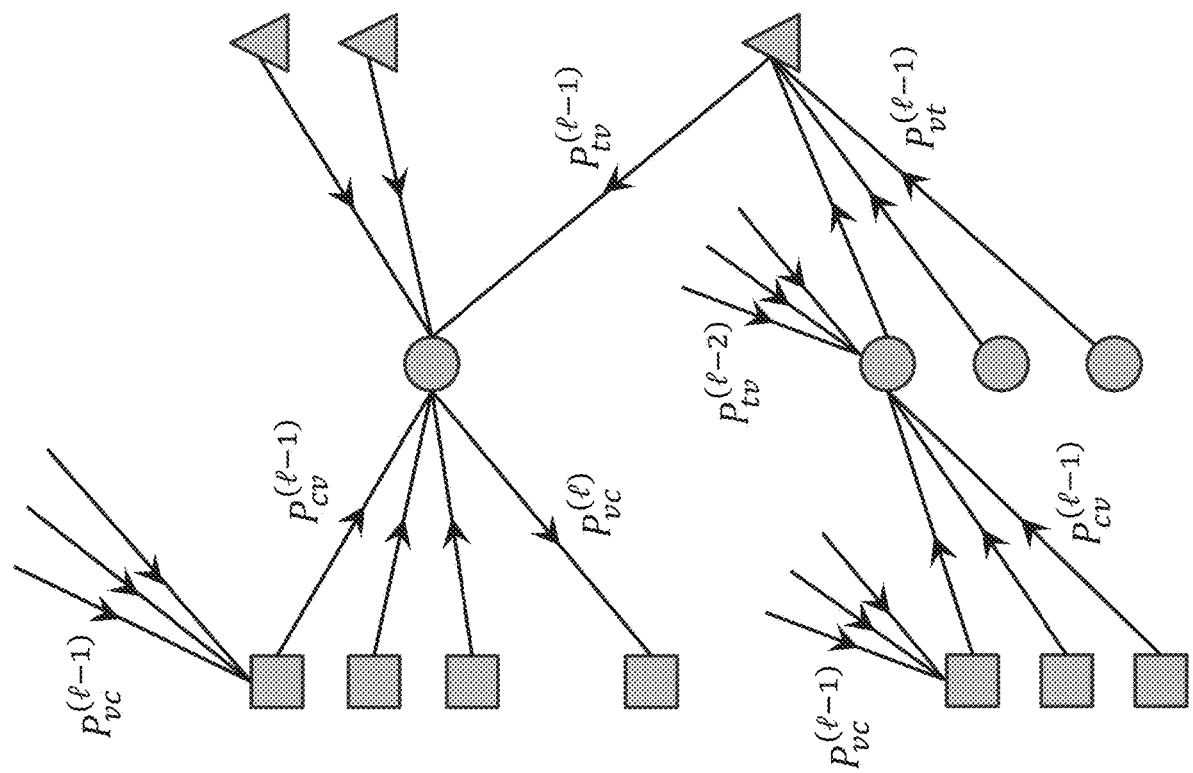
FIG. 5 conceptually illustrates message passing within a decoder implemented in accordance with an embodiment of the invention.

FIG. 5 demonstrates the messages passed in one iteration to update $m_{vc}^{(l)}$. By expressing the erasure probability of each message in terms of the erasure probability of its generating messages, a set of recursive equations for $P_{vc}^{(l)}$ can be obtained:

$$P_{vc}^{(l)}=\Gamma(P_{tv}^{(l-1)})\lambda(P_{cv}^{(l-1)}) \tag{12}$$

$$P_{tv}^{(l-1)}=1-(1-\epsilon)\psi(1-P_{vt}^{(l-1)}/2) \tag{13}$$

$$P_{vt}^{(l-1)}=L(P_{cv}^{(l-1)})\gamma(P_{tv}^{(l-2)}) \tag{14}$$

$$P_{cv}^{(l-1)}=1-\rho(1-P_{vc}^{(l-1)}) \tag{15}$$

$$P_{vc}^{(0)}=1 \tag{16}$$

$$P_{tv}^{(-1)}=1 \tag{17}$$

Equations (12) and (14) are derived from (10), while (13) and (15) are based on (11) and (9), respectively. The definition of the initial values for the recursion in (16) and (17) can be obtained since at the beginning of the decoding, every variable node is unknown and all edges carry erasure messages. Note that in each iteration, the fraction of non-recovered variable nodes is given by $$P_e^{(l)}=\Gamma(P_{tv}^{(l-1)})L(P_{cv}^{(l-1)}). \tag{18}$$

Optimizing Degree Distributions

One can determine $R_t^*(N_a, \epsilon)$ for a fixed $N_a$ and $\epsilon$, by finding the largest value of $R_t$ which leads to a zero convergence value for $P_{vc}^{(l)}$ in recursion (12) to (16). This could be done using a binary search on $R_t$.

An analysis can be performed with respect to the optimized degree distributions that lead to the largest per-user rate threshold for a fixed channel erasure probability $\epsilon^*$ and maximum number of active transmitters $N_a^*$:

$$\underset{\{\Gamma\},\{\lambda\},\{\rho\}}{\text{maximize}}\ R_t^*(N_a^*, \epsilon^*) \quad (19)$$

$$\text{subject to: } 0 \le R_c(\lambda, \rho) \le 1$$

$$R_t^* \le R_c/\Gamma'(1)$$

$$\Gamma_i = \lambda_i = \rho_i = 0, \quad i > d_{max}$$

$$\Gamma_i, \lambda_i, \rho_i \in [0, 1], \quad i \le d_{max}$$

$$\sum_i \Gamma_i = \sum_i \rho_i = \sum_i \lambda_i = 1$$

The second constraint limits the total number of transmissions per user so that it does not exceed T, as users cannot use a bit interval more than once in a frame. Differential evolution is described in Storn, Rainer, and Kenneth Price. "Differential evolution a simple and efficient heuristic for global optimization over continuous spaces." Journal of global optimization 11.4 (1997): 341-359, the disclosure of which including the relevant disclosure related to systems and methods for performing differential evolution is hereby incorporated by reference herein in its entirety. Differential evolution processes can be utilized to solve the above optimization problem. This meta-heuristic method, which is a combination of hill climbing and genetic algorithms can be utilized since it is capable of searching large parameter spaces effectively. As can readily be appreciated, any of a variety of processes can be utilized to solve the optimization problem as appropriate to the requirements of a given application.

The design procedure is as follows: By having the acceptable outage probability $P_{outage} = \mathbb{P}[N_a > N_a^*]$ and the average number of active transmitters $Np_a$, the maximum number of tolerable senders $N_a^*$ is determined. Then, by solving (19) one can calculate the optimized degree distributions leading to the maximum per-user transmission rate.

Table 2 shown in FIG. 6 presents the input load thresholds corresponding to optimized degree distributions for target load $N_a^*=7$ and different values of $\epsilon$ for $d_{max}$ limited to 13. As expected, as the probability of channel erasure grows, the code rate decreases to cope with channel impediments. In many embodiments, processes similar to those described above can be utilized to develop rate tables and/or sets of code parameters that are utilized by active transmitters in response to control messages generated based upon estimates of the number of active transmitters by the receiver.

Another observation from Table 2 is the abundance of degree-2 variable nodes in the code layer ($\lambda_2=1$). Such result is expected since rate threshold is the sole subject of maximization in (19). The number of degree-2 variable nodes plays a major role in the trade-off between error floor and the threshold. For that matter, one can consider constraining $\lambda_2$ in (19) to trade the rate threshold for error floor.

In the noiseless case ($\epsilon=0$), the optimization results in the highest code rate possible (in the presence of constraint on maximum node degree). This suggests that, in the noiseless scenario, by removing the code layer a better performance could be achieved. However, when the channel erasure exists, the MAC layer alone cannot recover all the transmitted bits. Proposition 2 introduces a lower bound on the fraction of non-recovered bits for the MAC layer.

Proposition 2. By having only the MAC layer, the fraction of non-recovered bits is lower-bounded by $\Gamma(\epsilon)$.

Proof. The MAC layer cannot recover a bit node if all its repetitions on the channel have been erased. All transmissions of a degree d bit node will be erased by the channel with probability $\epsilon^d$. By averaging over d:

$$\mathbb{E}\{\epsilon^d\} = \sum_i \Gamma_i \epsilon^i = \Gamma(\epsilon)$$

Therefore, the probability of erasing all transmissions of a bit is $\Gamma(\epsilon)$. □

As can readily be appreciated, there is a trade-off depending upon the selection of the code rate: on one hand, a low code rate increases the correction capability of the code layer, but on the other hand, it raises the load on the MAC layer, increasing the collisions and the risk of decoding failure.

Asymptotic Analysis of Decoding Threshold—Classic Linear Block Codes

The equations for erasure transfer functions of time and variable nodes are outlined above. To incorporate the performance of block MAP decoders into the analysis of a communication system that utilizes a two-layer access control system in accordance with an embodiment of the invention, the erasure transfer function of the MAP decoders can be derived. More specifically, the probability of decoding failure, given the i.i.d. erasure probability of codeword bits, is developed.

The set of indexes of erased and non-erased elements in a codeword can be defined as $\varepsilon$ and $\bar{\varepsilon} \subseteq \{1, 2, \ldots, n\}$, respectively. In addition, $c_\varepsilon$ is defined as the sub-vector of erased elements in c, and $H_\varepsilon$ as the sub-matrix composed by selecting corresponding columns of H in the set $\varepsilon$. For a linear block code $C(n, k, d_{min})$ with the parity check matrix H, c is a codeword if and only if $Hc^T=0$. This can be restated as $$H_\varepsilon c_\varepsilon^T + H_{\bar{\varepsilon}} c_{\bar{\varepsilon}}^T = 0$$

$$H_\varepsilon c_\varepsilon^T = H_{\bar{\varepsilon}} c_{\bar{\varepsilon}}^T.$$

Defining $H_{\bar{\varepsilon}} c_{\bar{\varepsilon}}^T = s^T$, $$H_\varepsilon c_\varepsilon^T = s^T. \quad (20)$$

Since s is known at the decoder, every codeword c satisfying (20) could be the MAP decoded codeword with equal probability. Therefore, for the decoder to be successful in retrieving all the erasures, the system of equations in (20) should lead to only one answer. This is equivalent to $H_\varepsilon$ having a full column rank. In other words, the block MAP decoding is successful if and only if $$\text{rank}(H_\varepsilon) = |\varepsilon|. \quad (21)$$

With i.i.d. erasure probability of $p_{in}$ for elements of a codeword, the probability of MAP decoding failure $P_e$ can be derived as follows $$P_e = \sum_{\mathcal{E} \subseteq \{1,2,\ldots,n\}} \mathbb{P}(\text{decoding failure} | \mathcal{E}) \mathbb{P}(\mathcal{E})$$

$$= \sum_{\mathcal{E} \subseteq \{1,2,\ldots,n\}} \mathbb{1}_{\text{rank}(H_\mathcal{E}) < |\mathcal{E}|} p_{in}^{|\mathcal{E}|} (1 - p_{in})^{n-|\mathcal{E}|}.$$

where $1_{test}$ is an indicator function, which is 1 when the test is satisfied and zero otherwise. Let. $|\mathcal{E}|=E$, we have $$P_e = \sum_{E=0}^{n} p_{in}^E (1-p_{in})^{n-E} \sum_{\substack{\mathcal{E} \subseteq \{1,2,\ldots,n\} \\ |\mathcal{E}|=E}} 1_{rank(H_\mathcal{E})<E}.$$

$P_E(H)$ can be considered as the ratio of the number of sub-matrices of H with non-complete column rank to the total number of sub-matrices of H with E columns:

$$P_E(H) = \frac{1}{\binom{n}{E}} \times \sum_{\substack{\mathcal{E} \subseteq \{1,2,\ldots,n\} \\ |\mathcal{E}|=E}} 1_{rank(H_\mathcal{E})<E}. \tag{22}$$

In fact, $P_E(H)$ is the probability of decoding failure in case of having E erasures in a codeword. The probability of having E erasures with erasure probability $p_{in}$ in a codeword of length n can be defined as $\pi_E(p_{in})$ as follows:

$$\pi_E(p_{in}) = \binom{n}{E} (p_{in})^E (1-p_{in})^{n-E}. \tag{23}$$

Therefore, the probability of decoding failure can be stated as follows $$P_e = \sum_{E=0}^{n} \pi_E(p_{in}) P_E(H) \tag{24}$$

$$= \sum_{E=0}^{n} \binom{n}{E} (p_{in})^E (1-p_{in})^{n-E} P_E(H) \tag{25}$$

Having $P_E(H)$ values of a linear block code for $0 \leq E \leq n$, one can determine the performance of the code under i.i.d. erasures using (24). In fact, $P_E(H)$ characterizes the erasure correction capability of the code, and $\pi_E(p_{in})$ represents the erasure imposed by the channel.

Figure 7:
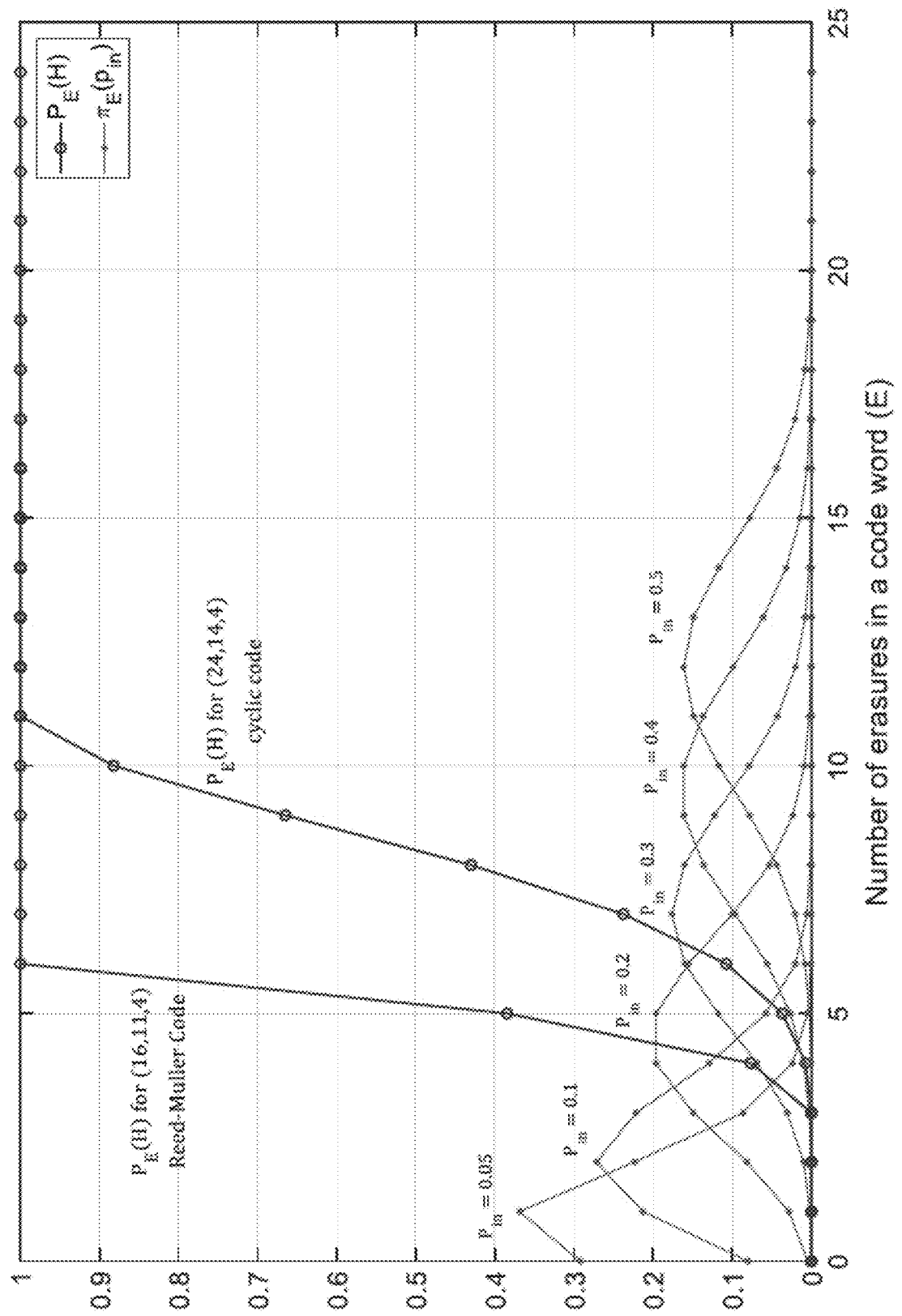
FIG. 7 is a chart showing performance of decoders in accordance with various embodiments of the invention that implement short block-length codes.

FIG. 7 shows $P_E(H)$ coefficients for a (24,14,4) code and a (16,11,4) Reed-Muller (RM) code, as well as $\pi_E(p_{in})$ for different values of $p_{in}$. It is evident in this figure and also (24) that when the overlap of non-zero values of $P_E(H)$ and $\pi_E(p_{in})$ (as a function of E) is smaller, the erasure correction performance of the code is stronger.

Exact computation of $P_E(H)$ is only feasible for short codes as it demands $O(2^n n^3)$ operations. This is when Gaussian elimination can be used with $O(n^3)$ operations to find the rank of $2^n$ matrices corresponding to each erasure pattern. However, a few simplifying factors can be considered without departing from the scope of the invention. First, every linear block code is capable of correcting all erasure patterns of weight $d_{min}-1$ or less. In addition, the rank of a parity check matrix (and all its sub-matrices) are at most n−k. Therefore, $$P_E(H)=0, E<d_{min} \tag{26}$$

$$P_E(H)=1, E>n-k. \tag{27}$$

As a result, $P_E(H)$ only needs to be computed for $d_{min} \leq E \leq n-k$, which is still complicated for long or low-rate codes. An alternative approach is to approximate $P_E(H)$.

Equation (28) demonstrates a step approximation which assumes the code can only correct erasure patterns of weight less than $d_{min}$. In fact, this approximation is accurate for a decoder which first replaces the erasures randomly from the alphabet (zeros and/or ones for binary codes), and then performs bounded distance decoding.

$$P_E(H) = \begin{cases} 0, & E < d_{min} \\ 1, & E \geq d_{min} \end{cases} \tag{28}$$

In the same direction, a linear approximation of $P_E(H)$ for $d_{min} \leq E \leq n-k$ can also be considered:

$$P_E(H) = \begin{cases} 0, & E < d_{min} \\ \dfrac{E-(d_{min}-1)}{(n-k+1)-(d_{min}-1)}, & d_{min} \leq E \leq n-k \\ 1, & E > n-k. \end{cases} \tag{29}$$

Figure 8:
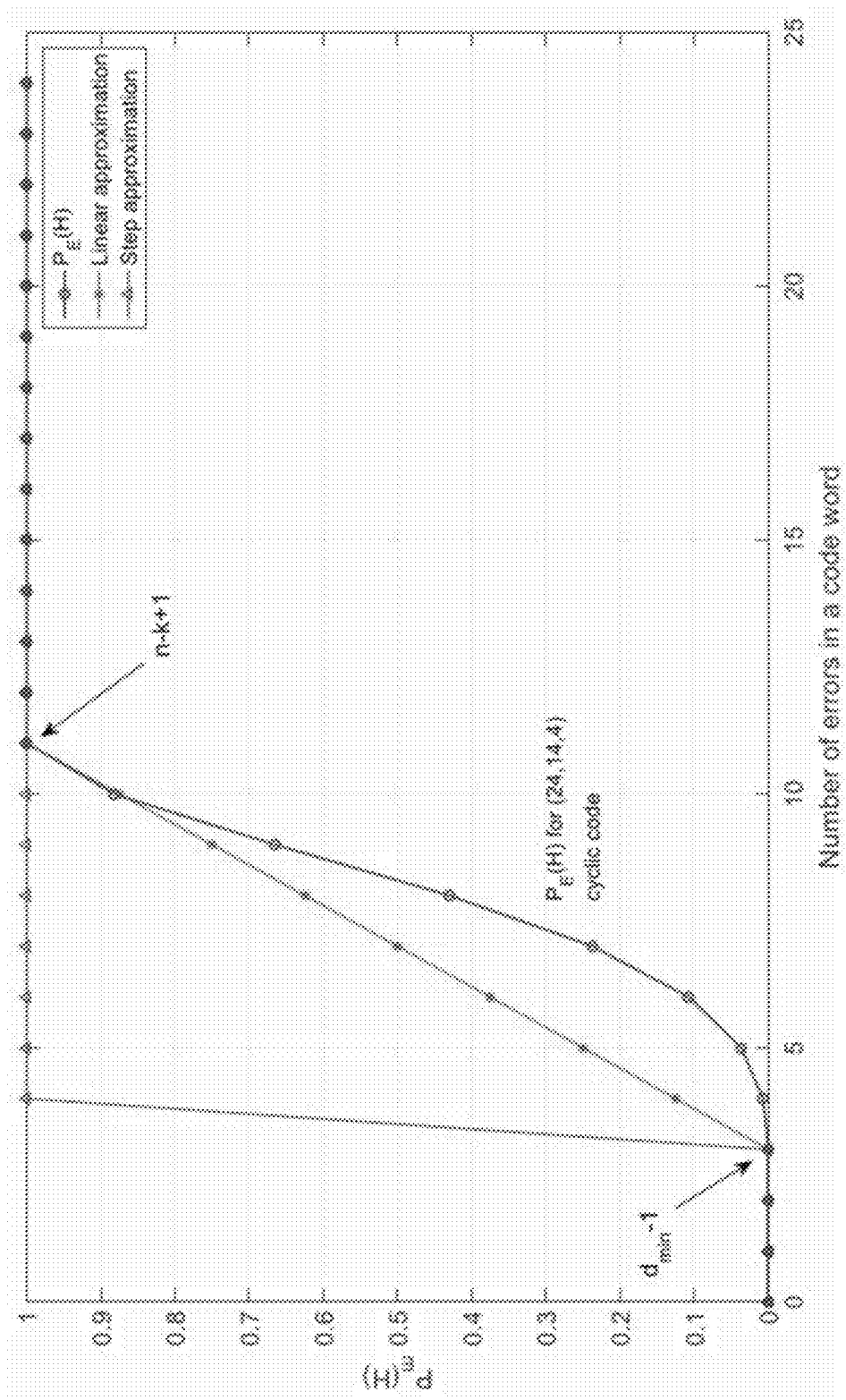
FIG. 8 is a chart showing a comparison of the values of $P_E(H)$ for a (24,14,4) cyclic code with step and linear approximations, respectively.

FIG. 8 compares the values of $P_E(H)$ for a (24,14,4) cyclic code with step and linear approximations in (28) and (29), respectively. It can be seen that the approximations are more accurate for codes whose minimum distance approaches n−k. In fact, it is most accurate when the code is MDS. It is also evident that the approximations offer lower bounds on code performance, and can be used for optimizing the system.

Tracking Decoder Erasure Probability

Figure 9:
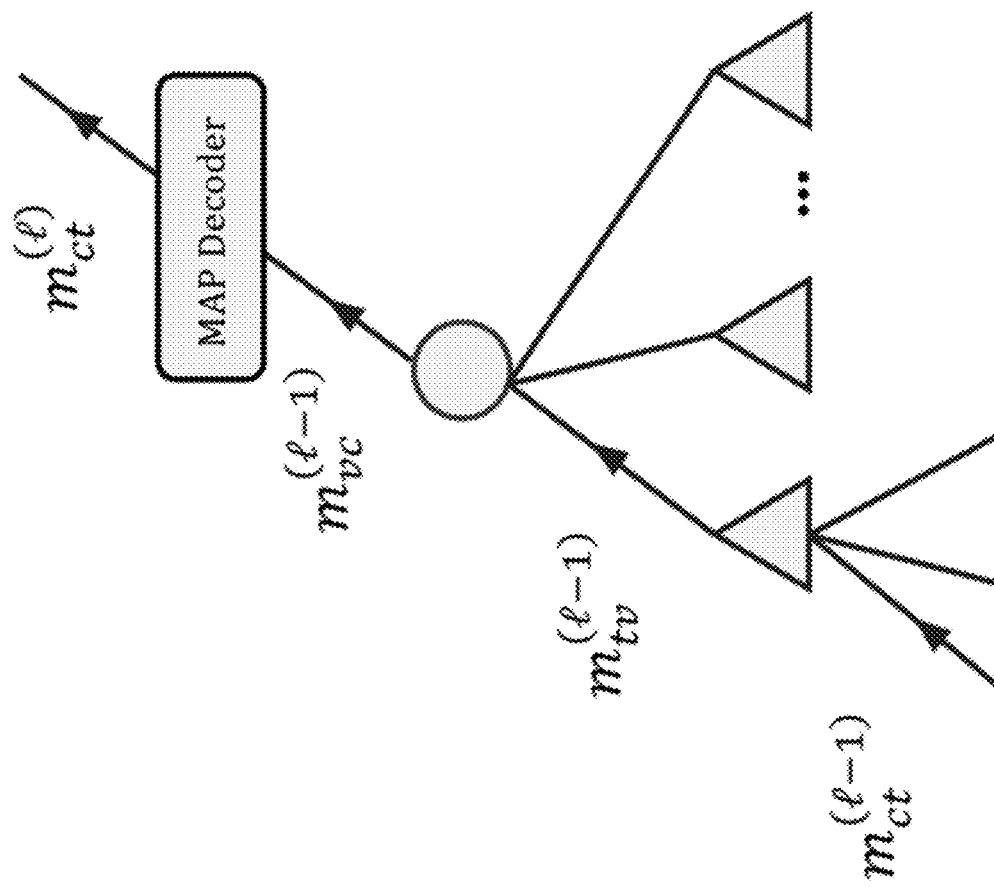
FIG. 9 conceptually illustrates message passing during a decoding iteration in accordance with an embodiment of the invention.

In the previous section, the probability of block MAP decoding failure is characterized. The evolution of erasure probability of a certain message can be tracked through different iterations for a fixed $N_a$ and $\epsilon$ in the proposed two-layer decoding architecture of FIG. 3C. FIG. 9 demonstrates the messages passed in one iteration to update $m_{ct}$. By expressing the erasure probability of each message in terms of the erasure probability of its generating messages, a set of recursive equations for $P_{ct}^{(l)}$ can be obtained. Using bit and time node erasure transfer functions from (10) and (11), the following can be obtained $$P_{tv}^{(\ell-1)} = 1 - (1-\epsilon)\psi\left(1 - \frac{P_{ct}^{(\ell-1)}}{2}\right) \tag{30}$$

$$P_{vc}^{(\ell-1)} = \gamma(P_{tv}^{(\ell-1)}) \tag{31}$$

From (24), $$P_{ct}^{(\ell)} = Pr(m_{ct}^{(\ell)} = e) \tag{32}$$

$$= Pr(m_{vc}^{(\ell-1)} = e, \text{decoding failure})$$

$$= P_{vc}^{(\ell-1)} \times \sum_{E=1}^{n} \binom{n-1}{E-1} P_{vc}^{(\ell-1)E-1} (1-P_{vc}^{(\ell-1)})^{n-E} P_E(H)$$

Since at the beginning of the decoding, every variable node is unknown and all edges carry erasure messages, the initial value for the recursion is $$P_{ct}^{(0)}=1. \tag{33}$$

Unlike a decoder that employs iterative codes such as (but not limited to) LDPC codes, where large code lengths allow for asymptotic analysis, for density evolution equations (30)

to (32) to be valid an assumption of a large number of active users in each frame $N_a$ is needed to conform to the asymptotic regime.

Optimizing Code and Repetition Rate Distribution

Using the recursive set of equations in (30)-(33), the user rate threshold $R_t^*$ can be computed corresponding to a repetition rate distribution $\{\Gamma\}$, parity check matrix H, number of active transmitters $N_a$, and channel erasure probability $\epsilon$. Considering the thresholding behavior of the decoder, if for a specific user rate $R_t^{(1)}$ the convergence value for $p_{ct}^{(l)}$ in equations (30) to (33) ($P_{ct}^{(\infty)}$) is positive, then $R_t^* < R_t^{(1)}$. On the contrary, a zero value of $P_{ct}^{(\infty)}$ for a user rate $R_t^{(2)}$ implies that $R_t^* \geq R_t^{(2)}$. As such, a binary search can be performed on $R_t^*$ to calculate the user rate threshold for a fixed $N_a$ and $\epsilon$.

Based upon the above results, a search can be performed for the pair of an optimized code and repetition rate distribution; i.e., the optimized code is selected from the ensemble of $C = \{c_1(n_1, k_1, d_1), \ldots, c_{|C|}(n_{|C|}, k_{|C|}, d_{|C|})\}$ along with an optimized degree distribution $\{\Gamma\}$. Furthermore, C could be part of a code family, e.g., Reed-Muller codes, Hamming codes, and Expander codes, or in general, it could be a set of arbitrary binary linear block codes. The pair can be solved by solving the following optimization using Differential Evolution.

$$\begin{aligned} &\underset{\{\Gamma\}, c(n,k,d)}{\text{maximize}} \quad R_t^*(N_a^*, \epsilon^*) \quad &(34)\\ &\text{subject to:} \quad c \in C\\ &R_t^* \leq R_c/\Gamma'(1) \quad \begin{array}{l} \Gamma_i = 0, \quad i > d_{max}\\ \Gamma_i \in [0, 1], \quad i \leq d_{max} \end{array}\\ &\sum_i \Gamma_i = 1 \end{aligned}$$

Table 3 shown in FIG. 10 lists the optimized codes and degree distributions using linear approximation and Reed-Muller codes up to length 128 as the ensemble C. It is evident that with a larger number of users, the system tries to reduce collisions by increasing the portion of the bit nodes with only one repetition.

Simulation Results

Numerical and simulation results can be utilized to analyze the performance of communication systems that utilize two-layer coded access schemes over a binary adder channel with erasures in accordance with various embodiments of the invention. First, a multiple access setting is considered, where the number of active users $N_a$ is known both at the transmitters and the receivers. Next, a random access scenario is considered, where the number of active users is random in each frame and only known at the receiver.

Multiple Access Channel

Figure 11:
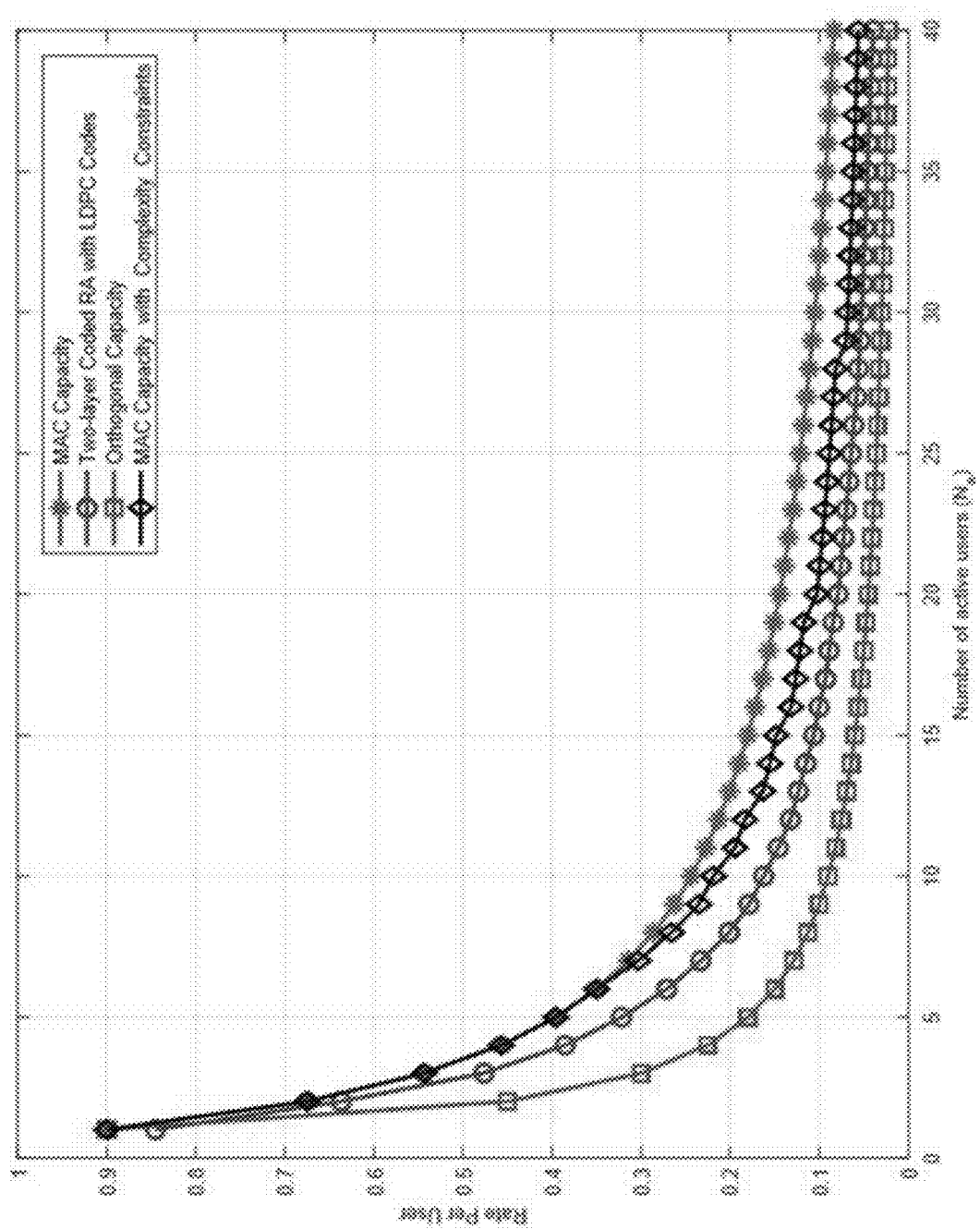
FIG. 11 depicts the rate per user performance (b/s/Hz) of the proposed coded access scheme with LDPC codes as a function of the number of active users over the binary adder channel with erasure probability $\epsilon=0.1$.

FIG. 11 depicts the rate per user performance (b/s/Hz) of the proposed coded access scheme with LDPC codes as a function of the number of active users over the binary adder channel with erasure probability $\epsilon = 0.1$. The performance is obtained by solving the design optimization problem (19) for each $N_a^*$ and $d_{max} = 13$.

For comparison, the capacity of the multiple access channel is also presented, and the multiuser capacity with orthogonal transmission. As evident, the proposed scheme noticeably outperforms an ideally coded orthogonal transmission scheme.

Of interest is also a comparison with a complexity-constrained capacity of a binary adder MAC with erasure. Suppose that due to complexity constraints, only K-fold ($K < N_a$) collisions over each time-slot are allowed. The sum-rate capacity of an adder erasure MAC with a K-fold constraint is given by (2) as $C_K$. Furthermore, suppose that the complexity constraint is expressed in terms of time-node degree distribution $\psi(x) = \sum_{k=1}^{K} \psi_k x^k$, where $\psi_k$ represents the fraction of time nodes of degree k. The sum-rate capacity of adder MAC with time-node degree distribution constraint is given by $$\sum_{k=1}^{K} \psi_k C_K. \qquad (35)$$

It can be seen in FIG. 11 that the proposed scheme has a small performance gap with the (constrained or unconstrained) MAC capacity. This performance is obtained with the proposed sub-optimal decoder whose complexity grows only linearly with the number of users, code length and maximum degree of nodes.

Random Access Channel

For different maximum numbers of active transmitters $N_a^*$, optimized random access codes can be designed by solving (19) and (34). Translating the maximum number of active transmitters into target outage probabilities for a Poisson distribution of number of active users, the performance of the system for different average input loads, $Np_a$ can then be simulated.

In simulating the code layer, the LDPC codes are constructed randomly from optimized degree distributions by avoiding cycles of size 4. Although more advanced code construction methods can be considered for practical implementation. For the classic linear block codes, the family of Reed-Muller codes can be used as the search space C in the optimization problem (34). Reed-Muller codes offers a class of highly structured linear block codes with predefined minimum distances. This is important in the current setting, since it allows performance of the code family to be characterized using the approximations (28) and (29) simply by the code parameters $m^{(RM)}$ and $r^{(RM)}$.

Figure 12:
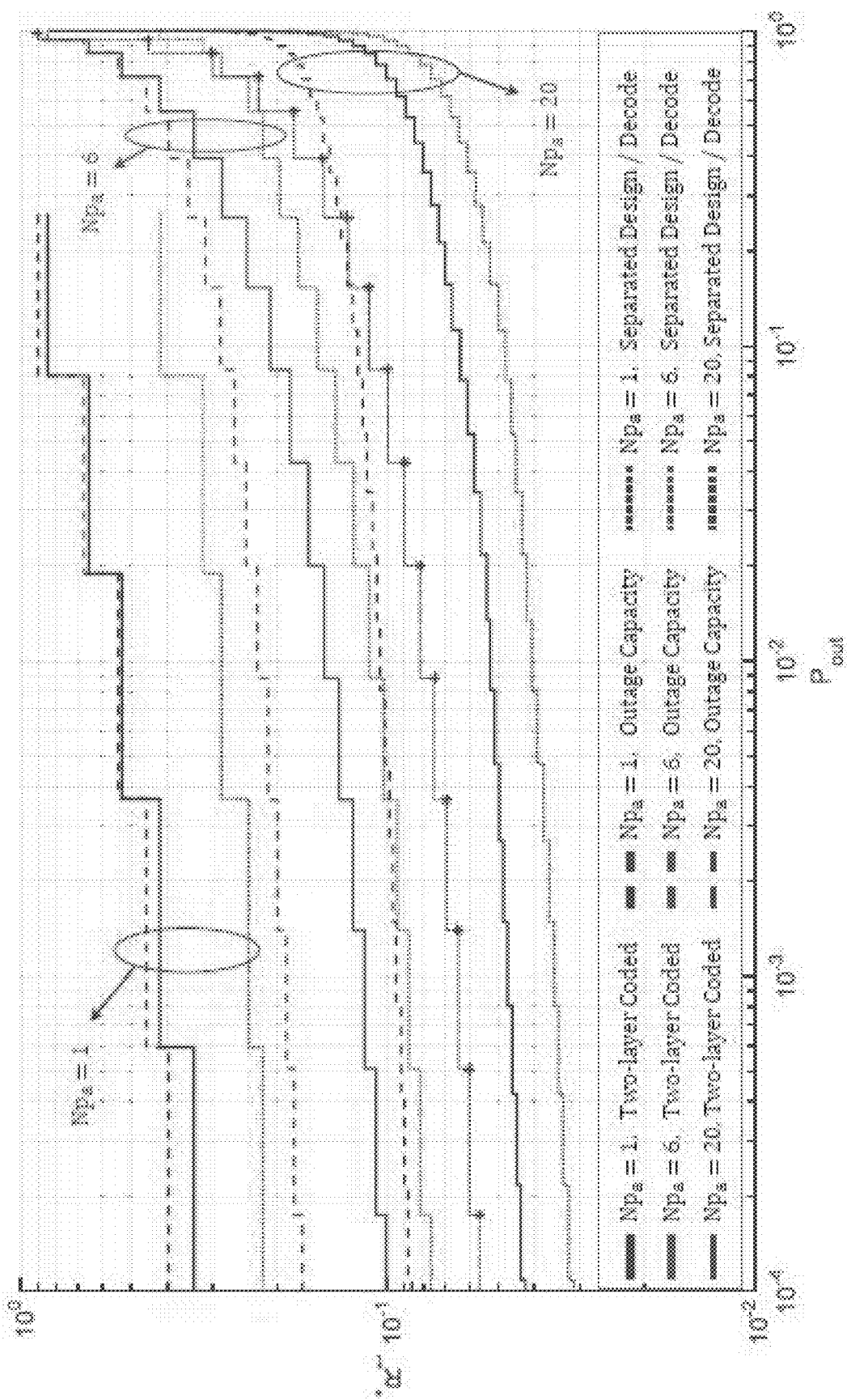
FIG. 12 is a chart that depicts the maximized per-user transmission rate for different values of outage probability using the LDPC codes, along with the corresponding outage capacity curves (without complexity constraints).

FIG. 12 demonstrates the maximized per-user transmission rate $R_t$ for different values of outage probability using the LDPC codes, along with the corresponding outage capacity curves (without complexity constraints). The proposed design noticeably outperforms the outage capacity of orthogonal signaling (computed by letting $C_{Na} = 1 - \epsilon$ in (3)), confirming that indeed allowing collisions in this framework is beneficial. Furthermore, performance of two-layer coded access schemes is compared with a benchmark system, in which the MAC layer is optimized for a non-erasure channel and the code layer is an LDPC code designed for the BEC($\epsilon$). Unlike a system in accordance with an embodiment of the invention that utilizes a two-layer access control system in which the MAC layer and the code layer cooperate by iteratively passing messages back and forth to achieve joint resolution of collisions and erasures, the two layers in the benchmark scheme operate in tandem. One sees that the proposed scheme noticeably outperforms the benchmark and approaches the corresponding outage capacity curves. Also evident is a rather graceful trade-off of quality of service (quantified by probability of outage) and throughput performance (achievable rate). A more stringent QoS constraint imposes a greater toll on throughput.

Figure 13:
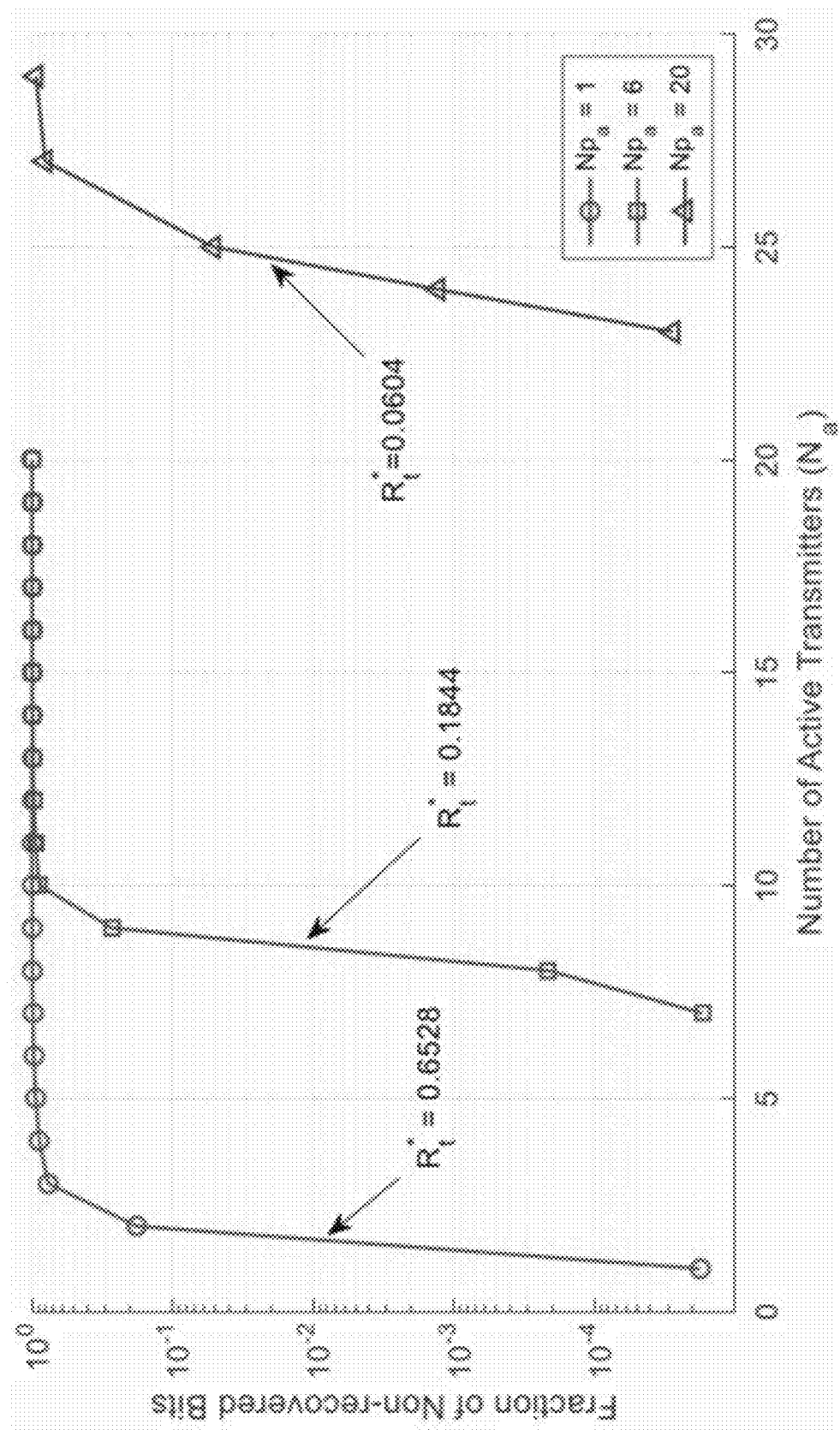
FIG. 13 is a chart that shows the performance of the proposed system using LDPC codes as a function of the actual number of active transmitters.

FIG. 13 shows the performance of the proposed system using LDPC codes as a function of the actual number of active transmitters. Although the curves in FIG. 13 are evaluated for limited code and frame lengths, in line with the asymptotic analysis described above, the system exhibits a threshold effect at the designed maximum number of active senders, $N_a^*$.

Figure 14:
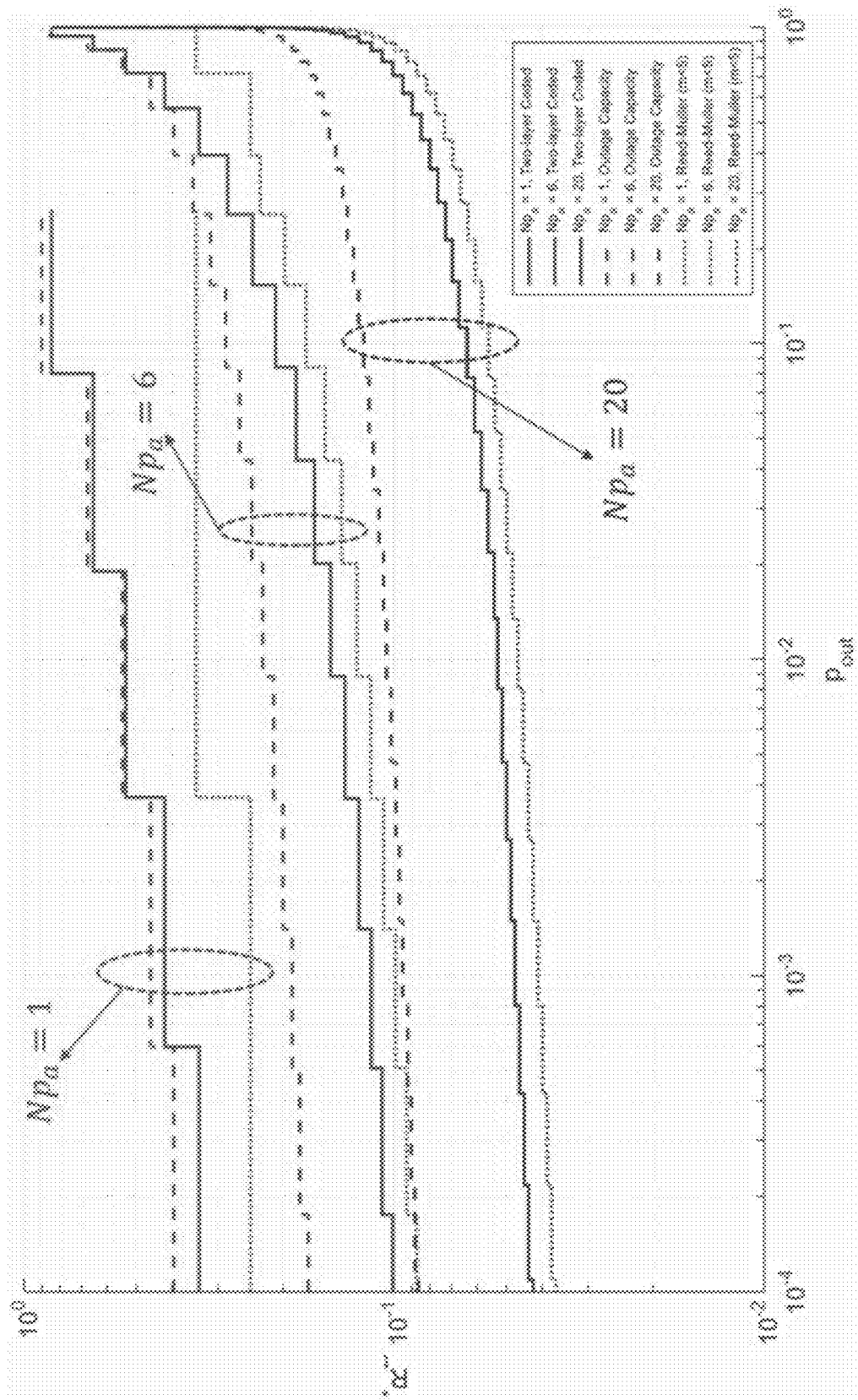
FIG. 14 is a chart that compares the optimized user rate threshold using the family of Reed-Muller codes for $m^{(RM)}<5$, with the same system using LDPC codes for $\epsilon=0.1$ and $d_{max}=13$

FIG. 14 compares the optimized user rate threshold using the family of Reed-Muller codes for $m^{(RM)}<5$, with the same system using LDPC codes for $\epsilon=0.1$ and $d_{max}=13$. Exact performance of the RM codes ($P_E(H)$) has been used to design the system (solving (34)). As shown in the figure, by increasing the average number of active transmitters $Np_a$, the performance gap between the short and long codes decreases.

Figure 15:
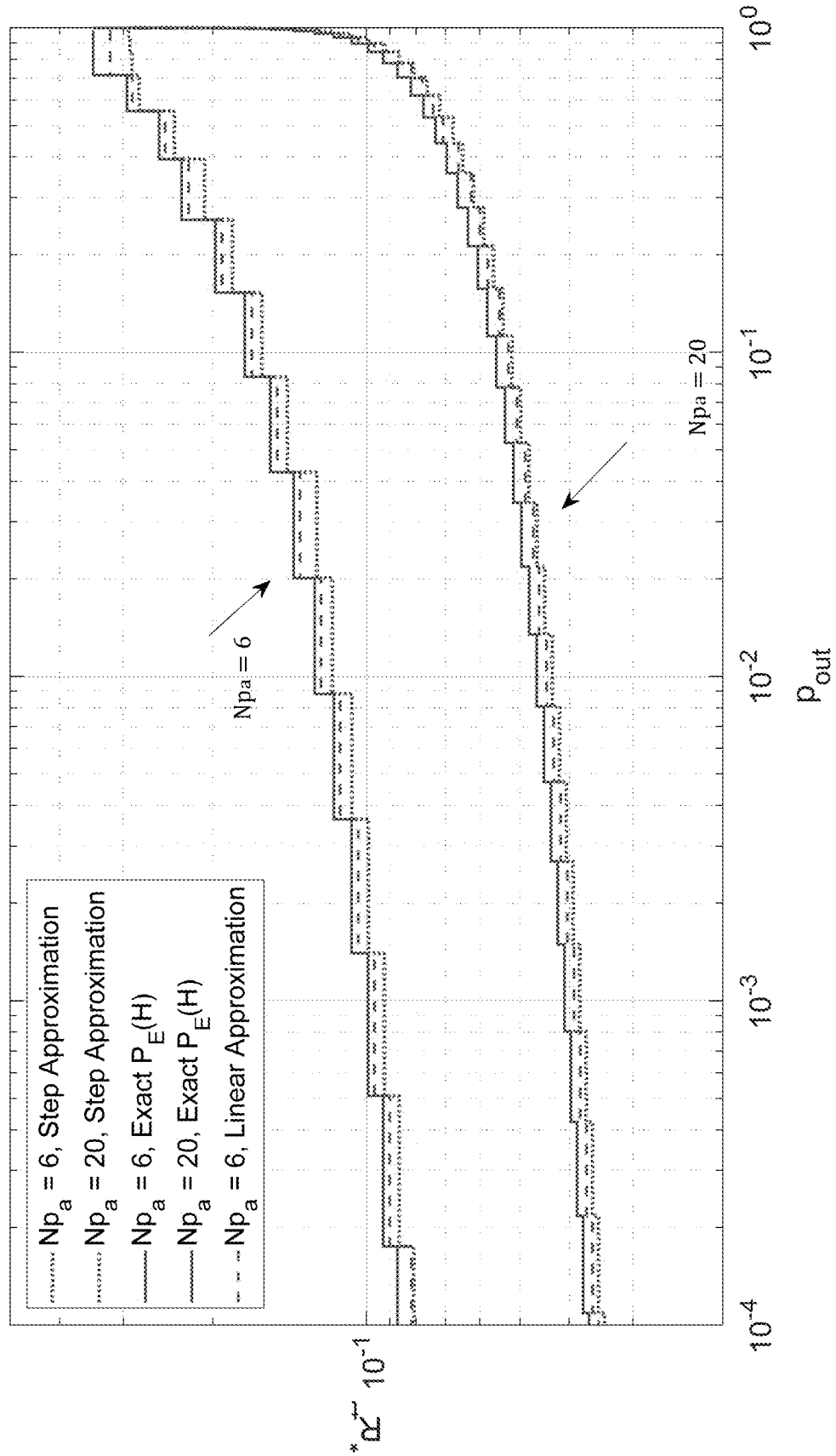
FIG. 15 is a chart that compares the optimized user rate threshold using exact and approximated values of $P_E(H)$ for Reed-Muller codes with $m^{(RM)}<5$ for $\epsilon=0.1$ and $d_{max}=13$.

FIG. 15 compares the optimized user rate threshold using exact and approximated values of $P_E(H)$ for Reed-Muller codes with $m^{(RM)}<5$ for $\epsilon=0.1$ and $d_{max}=13$. As expected, compared to the step approximation, optimized rates using linear approximation are closer to those based on exact values of $P_E(H)$. In fact, the codes selected in the optimization process for linear approximation and exact $P_E(H)$ are the same. Also, the optimized degree distributions resulted from both approaches are very similar.

Although the present invention has been described in certain specific aspects, many additional modifications and variations would be apparent to those skilled in the art. It is therefore to be understood that the present invention can be practiced otherwise than specifically described including any of a variety of short and long block length codes including capacity approaching codes and/or other iterative codes that can be decoded in a two layer access system using message passing and/or communication systems that operate over other types of multiple access communications channels without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A communication system, comprising:
    a plurality of transmitters configured to transmit signals simultaneously via a random access channel, where each transmitter comprises:
        an encoder configured to encode a packet of data bits using a two-layer code comprising an inner medium access control code and an outer error correcting code, where encoding a packet of data bits using the two-layer code comprises:
            encoding a packet of user data bits using the outer error correcting code to obtain encoded bits;
            selecting a repetition rate for each encoded bit; and
            selecting a subset of bit intervals on which to transmit each encoded bit at its selected repetition rate; and
        a modulator configured to modulate each encoded bit at its selected repetition rate for transmission via the random access channel during the selected subset of bit intervals;
    a receiver configured to receive the simultaneously transmitted signals from the plurality of transmitters via the random access channel, wherein the receiver comprises:
        a demodulator configured to demodulate received signals and provide input signals to a decoder; and
        wherein the decoder is configured to:
            iteratively decode packets of user data bits received from the plurality of transmitters using message passing between an inner medium access control layer and an outer coding layer to jointly perform collision resolution of user data bits and decoding of user data bits from the input signals received from the demodulator, wherein the inner medium access control layer and outer coding layer operate in lockstep while passing messages back and forth such that the inner medium access control layer resolves collisions and the outer coding layer resolves erasures; and
            output decoded packets of user data.

2. The communication system of claim 1, wherein each encoder is configured to select a repetition rate for each encoded bit based upon channel conditions.

3. The communication system of claim 1, wherein the selected repetition rate for at least one of the encoded bits is greater than one.

4. The communication system of claim 1, wherein the outer error correcting code is a Low Density Parity Check Code.

5. The communication system of claim 4, wherein:
    the decoder comprises a set of check nodes, a set of time nodes, and a set of variable nodes;
    the decoder performs a decoding iteration starting with the inner medium access control layer by:
        the set of time nodes sending messages containing their estimates of the values of the variable nodes to the set of variable nodes; and
        updating values at the set of variable nodes based upon the received messages from the set of time nodes; and
    the decoder continues the decoding iteration by performing a round at the outer coding layer comprising:
        the set of variable nodes sending their updated values to the set of check nodes;
        the set of check nodes sending messages containing their estimates of the values of the variable nodes to the set of variable nodes; and
        further updating values at the set of variable nodes based upon the received messages from the set of check nodes; and
    the decoder completes the decoding iteration at the inner medium access control layer by the set of variable nodes sending their further updated values to the set of time nodes.

6. The communication system of claim 5, wherein the decoder continues to iterate until a stopping criterion is reached.

7. The communication system of claim 1, wherein the outer error correcting code is a short block-length code.

8. The communication system of claim 7, wherein:
    the decoder comprises a set of decoders, a set of time nodes, and a set of variable nodes;
    the decoder performs a decoding iteration starting with the inner medium access control layer by:
        the set of time nodes sending messages containing their estimates of the values of the variable nodes to the set of variable nodes; and
        updating values at the set of variable nodes based upon the received messages from the set of time nodes; and
    the decoder continues the decoding iteration by performing a round at the outer coding layer comprising:
        the set of variable nodes sending their updated values to the set of decoders;
        the set of decoders sending messages containing their estimates of the values of the variable nodes to the set of variable nodes; and further updating values at the set of variable nodes based upon the received messages from the set of decoders; and the decoder completes the decoding iteration at the inner medium access control layer by the set of variable nodes sending their further updated values to the set of time nodes.

9. The communication system of claim 8, wherein the decoder continues to iterate until a stopping criterion is reached.

10. The communication system of claim 1, wherein:
prior to commencement of a frame, the receiver is configured to:
determine a number of the plurality of transmitters expected to actively transmit during the frame; and
specify code parameters for the two-layer code utilized by the plurality of transmitters when transmitting during the frame based upon the number of the plurality of transmitters expected to actively transmit during the frame; and
the plurality of transmitters that actively transmit during the frame are configured to encode packets of user data using the code parameters for the two-layer code specified by the receiver.

11. The communication system of claim 10, wherein the code parameters for the two-layer code comprise at least one code parameter selected from the group consisting of: a code book for the error correcting code, which also sets its rate; a pattern of bit intervals used to select a subset of bit/symbol intervals on which to transmit each encoded bit/symbol at its selected repetition rate; and a repetition rate for an encoded bit.

12. The communication system of claim 10, wherein:
the receiver further comprises a transmitter configured to transmit control messages that specify code parameters for the two-layer code utilized by the plurality of transmitters; and
each transmitter further comprises a receiver configured to receive control messages transmitted by the receiver.

13. The communication system of claim 12, wherein the control messages further comprise a beacon message indicating a start of the frame.

14. A receiver configured to receive transmitted signals from a plurality of transmitters configured to transmit signals simultaneously via a random access channel, wherein the receiver comprises:
a demodulator configured to demodulate simultaneously received signals and provide input signals to a decoder; and
wherein the decoder is configured to:
iteratively decode packets of user data bits received from a plurality of transmitters using message passing between an inner medium access control layer and an outer coding layer to jointly perform collision resolution of user data bits and decoding of user data bits from the input signals received from the demodulator, wherein the inner medium access control layer and outer coding layer operate in lockstep while passing messages back and forth such that the inner medium access control layer resolves collisions and the outer coding layer resolves erasures; and
output decoded packets of user data.

15. The receiver of claim 14, wherein:
the outer coding layer utilizes an iterative error correcting code;
the decoder comprises a set of check nodes, a set of time nodes, and a set of variable nodes;
the decoder performs a decoding iteration starting with the medium access control layer by:
the set of time nodes sending messages containing their estimates of the values of the variable nodes to the set of variable nodes; and
updating values at the set of variable nodes based upon the received messages from the set of time nodes; and
the decoder continues the decoding iteration by performing a round at the code layer comprising:
the set of variable nodes sending their updated values to the set of check nodes;
the set of check nodes sending messages containing their estimates of the values of the variable nodes to the set of variable nodes; and
further updating values at the set of variable nodes based upon the received messages from the set of check nodes; and
the decoder completes the decoding iteration at the inner medium access control layer by the set of variable nodes sending their further updated values to the set of time nodes.

16. The receiver of claim 14, wherein:
the outer coding layer uses a short block-length code error correcting code;
the decoder comprises a set of decoders, a set of time nodes, and a set of variable nodes;
the decoder performs a decoding iteration starting with the inner medium access control layer by:
the set of time nodes sending messages containing their estimates of the values of the variable nodes to the set of variable nodes; and
updating values at the set of variable nodes based upon the received messages from the set of time nodes; and
the decoder continues the decoding iteration by performing a round at the code layer comprising:
the set of variable nodes sending their updated values to the set of decoders;
the set of decoders sending messages containing their estimates of the values of the variable nodes to the set of variable nodes; and
further updating values at the set of variable nodes based upon the received messages from the set of decoders; and
the decoder completes the decoding iteration at the inner medium access control layer by the set of variable nodes sending their further updated values to the set of time nodes.

17. The receiver of claim 14, where prior to commencement of a frame, the receiver is configured to:
determine a number of transmitters expected to actively transmit during the frame; and
specify code parameters for a two-layer code utilized by active transmitters when transmitting during the frame based upon the number of transmitters expected to actively transmit during the frame.

18. The receiver of claim 17, wherein the receiver further comprises a transmitter configured to transmit control messages that specify code parameters for a two-layer code.

* * * * *